United States Patent
Atsatt et al.

(10) Patent No.: US 11,960,734 B2
(45) Date of Patent: Apr. 16, 2024

(54) LOGIC FABRIC BASED ON MICROSECTOR INFRASTRUCTURE WITH DATA REGISTER HAVING SCAN REGISTERS

(71) Applicant: Intel Corporation, Santa Clara, CA (US)

(72) Inventors: Sean R Atsatt, Santa Cruz, CA (US); Ilya K. Ganusov, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 585 days.

(21) Appl. No.: 17/033,348

(22) Filed: Sep. 25, 2020

(65) Prior Publication Data

US 2021/0011636 A1    Jan. 14, 2021

(51) Int. Cl.
*G06F 3/06*     (2006.01)
*G06N 3/08*     (2023.01)
*H03K 19/17724*     (2020.01)

(52) U.S. Cl.
CPC .......... *G06F 3/0622* (2013.01); *G06F 3/0655* (2013.01); *G06F 3/0673* (2013.01); *G06N 3/08* (2013.01)

(58) Field of Classification Search
None
See application file for complete search history.

(56) References Cited

U.S. PATENT DOCUMENTS

| | | | |
|---|---|---|---|
| 6,255,848 B1 | 7/2001 | Schultz et al. | |
| 9,432,298 B1 | 8/2016 | Smith | |
| 10,523,207 B2 | 12/2019 | How et al. | |
| 10,673,440 B1 | 6/2020 | Camarota | |
| 2007/0143577 A1 | 6/2007 | Smith | |
| 2018/0262198 A1 | 9/2018 | Tate et al. | |
| 2019/0043536 A1* | 2/2019 | Weber | H03K 19/1776 |
| 2021/0013885 A1* | 1/2021 | Atsatt | H03K 19/17728 |
| 2023/0251839 A1* | 8/2023 | Shah | G06F 30/34 |
| | | | 717/149 |

OTHER PUBLICATIONS

European Search Report for Application No. 21190591.4 dated Feb. 11, 2022.

* cited by examiner

*Primary Examiner* — Jany Richardson
(74) *Attorney, Agent, or Firm* — Fletcher Yoder, P.C.

(57) ABSTRACT

Systems and methods described herein may relate to providing a dynamically configurable circuitry able to be programed using a microsector granularity. Furthermore, selective partial reconfiguration operations may be performed use write operations to write a new configuration over existing configurations to selectively reprogram a portion of programmable logic. A quasi-delay insensitive (QDI) shift register and/or control circuitry receiving data and commands from an access register disposed between portions of programmable logic may enable at least some of the operations described.

20 Claims, 14 Drawing Sheets

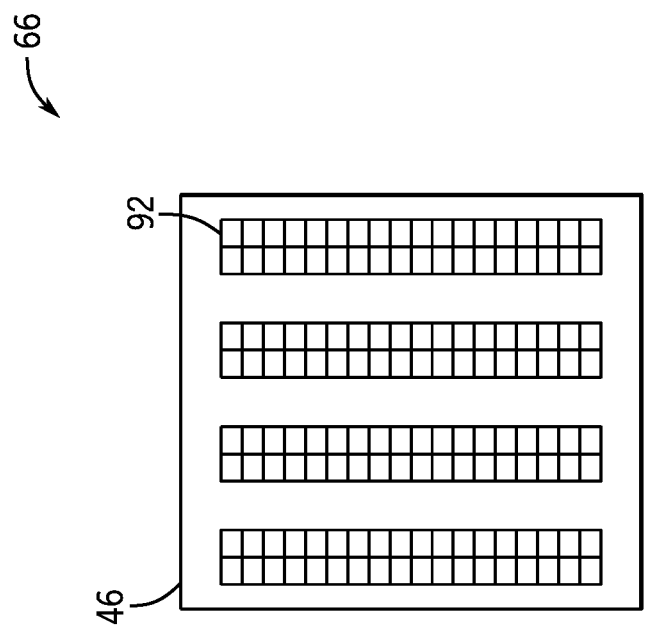

LOGIC FABRIC BASED ON MICROSECTOR INFRASTRUCTURE WITH DATA REGISTER HAVING SCAN REGISTERS

BACKGROUND

The present disclosure relates generally to integrated circuit devices that use programmable structures based on microsectors.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Advances in microelectronics have enabled the continued increase in transistor densities and bandwidths for a variety of integrated circuit devices and communication techniques. Indeed, some advanced integrated circuits, such as field programmable gate arrays (FPGAs) or other programmable logic devices, may include large number of transistors that enable an increasingly wide variety of programmable circuit designs to be programmed into programmable fabric for implementation of a large number of different functions. In some cases, data generated by the functions may be packetized and routed to or from other devices to execute an operation or to communicate results of an operation. However, since a circuit design for a programmable logic device may be customized by a user for a particular application, relatively large sector-based registers used in logic fabric of these devices may over-allocate regions within the logic fabric for the circuit design.

BRIEF DESCRIPTION OF THE DRAWINGS

Advantages of the present disclosure may become apparent upon reading the following detailed description and upon reference to the drawings in which:

FIG. 5 is a block diagram of the programmable logic of FIG. 4B, in accordance with an embodiment;

DETAILED DESCRIPTION OF SPECIFIC EMBODIMENTS

Figure 1:
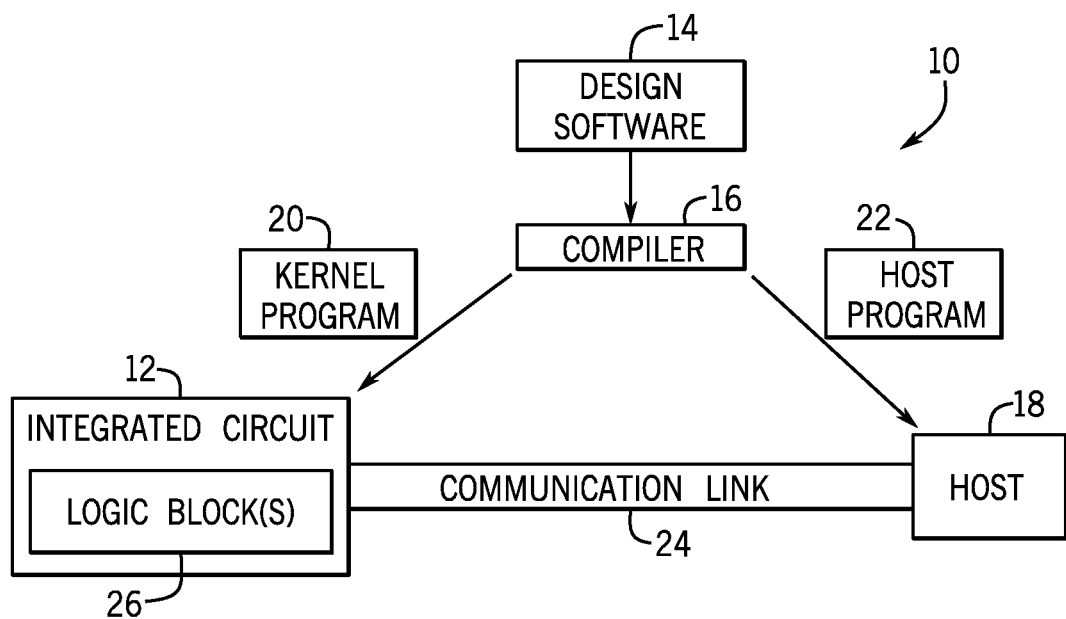
FIG. 1 is a block diagram of a system used to program an integrated circuit, in accordance with an embodiment.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical exclusive-OR (XOR)). In other words, the phrase A "or" B is intended to mean A, B, or both A and B.

Programmable logic devices are increasingly permeating markets and are increasingly enabling customers to implement circuit designs in logic fabric (e.g., programmable logic). Due to the highly customizable nature of programmable logic devices, the logic fabric is to be configured with a circuit design prior to use of the circuit corresponding to the circuit design. When implementing designs in the logic fabric, sectors may be used to allocate portions of the logic fabric to implementation of the circuit. However, a sector may be a relatively imprecise and/or large allocation of total logic fabric area due at least in part to data registers and physical arrangements of interconnections of the programmable logic device.

By rearranging some of the interconnections of the programmable logic device and/or by shrinking a data width of the data registers, systems and processes for implementing a circuit design in logic fabric may improve. For example, by making some of these changes, a size of the sector may be reduced and form a mircosector, permitting a relatively finer granularity of assignment to be used to allocate the logic fabric to the circuit design. This may, for example, permit a more efficient allocation of resources to respective circuit designs, and thus enable circuit designs to use less resources in implementation.

Since a circuit design for a programmable logic device may be customized by a user for a particular application, the ability to partition and control the configuration of the device at a fine grain and in parallel (as may be afforded by rearrangement of the interconnections and/or shrinking of a data width of data registers) enables a number of advantages particular to devices with programmable logic. Some of the advantages may be in the construction of the device and some advantages are in the use models for the device that are enabled (e.g., enabled or permitted use cases). For construction of the device, fine grained configurable regions may be a mechanism to enable building a device with a suitable or tailored amount of resources for implementation of that device. Some of the new use models are enabled by faster configuration, faster partial reconfiguration, and faster single event update (SEU) detection for smaller regions of the device when compared to other systems and methods for programmable logic device programming.

These changes in system implementation may also improve (e.g., reduce) overall configuration times, including reducing configuration times used when performing partial reconfigurations, and may also enable faster single event upset (SEU) detection. For example, the proposed structural changes described herein may enable partial reconfiguration to occur in similar amounts of time as a normal configuration.

The microsector infrastructure may use a smaller number of columns (e.g., 8 columns vs 50 columns) in a single fabric row (row region). The row region may receive data from a smaller data register (e.g., 1 bit data register as opposed to a 32 bit data register). Since a mircosector may represent a relatively small percentage of area of a programmable logic device (e.g., less than 1% of total fabric area), it may be feasible to have the microsector become the partial reconfiguration quanta. This may enable the partial reconfiguration to be a write-only operation that avoids performing a read-modify-write each time partial reconfiguration is to occur for the microsector, thereby saving time and resources for the partial reconfiguration. In some cases, the partial reconfiguration time may be reduced by a factor of five or six, a relatively high amount of performance improvement. Furthermore, since the number of columns is reduced, the amount of time spent in waiting for a data transmission to complete (either to the row region or from the row region) is reduced, thereby improving operation of the programmable logic device.

As may be appreciated with discussion of FIGS. 12-15, sometimes it may be desired to move one or more scan registers from adaptive logic elements (ALEs) of the microsector to a data register servicing the microsector. Doing so may reduce a number of scan registers used to support operations of the microsector, such as by a factor of ten. Moving scan registers out of the ALEs with additional structural adjustments, further performance improvements may be achieved. For example, including quasi-delay insensitive (QDI) circuitry may enable relatively faster shifting of user data out of a frame read from configuration memory (CRAM) of the microsector and may enable filtering of user data that is unused out of the frame, thereby increasing processing speeds. QDI circuitry may not use clock signals when transmitted data through serially coupled registers, rather using handshaking signals to transmit the data through circuitry acting as a register. Indeed, QDI circuitry may shift data without using a rising edge of a clock to progress the transmission. By generally not using clocking signals, QDI circuitry may be relatively less susceptible to delays introduced through disbursements of clocks and/or inconsistencies of clock-based registers, and thus may improve data access operations. Other benefits may also be achieved by using these systems and methods. It is noted that ALEs may sometimes be referred to as "adaptive logic modules" (ALMs), and are used herein interchangeably.

With the foregoing in mind, FIG. 1 illustrates a block diagram of a system 10 that may implement arithmetic operations. A designer may desire to implement functionality, such as the arithmetic operations of this disclosure, on an integrated circuit 12 (e.g., a programmable logic device such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit 12 without specific knowledge of low-level hardware description languages (e.g., Verilog or VHDL). For example, since OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

The designer may implement high-level designs using design software 14, such as a version of INTEL® QUARTUS® by INTEL CORPORATION. The design software 14 may use a compiler 16 to convert the high-level program into a lower-level description. The compiler 16 may provide machine-readable instructions representative of the high-level program to a host 18 and the integrated circuit 12. The host 18 may receive a host program 22 which may be implemented by the kernel programs 20. To implement the host program 22, the host 18 may communicate instructions from the host program 22 to the integrated circuit 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
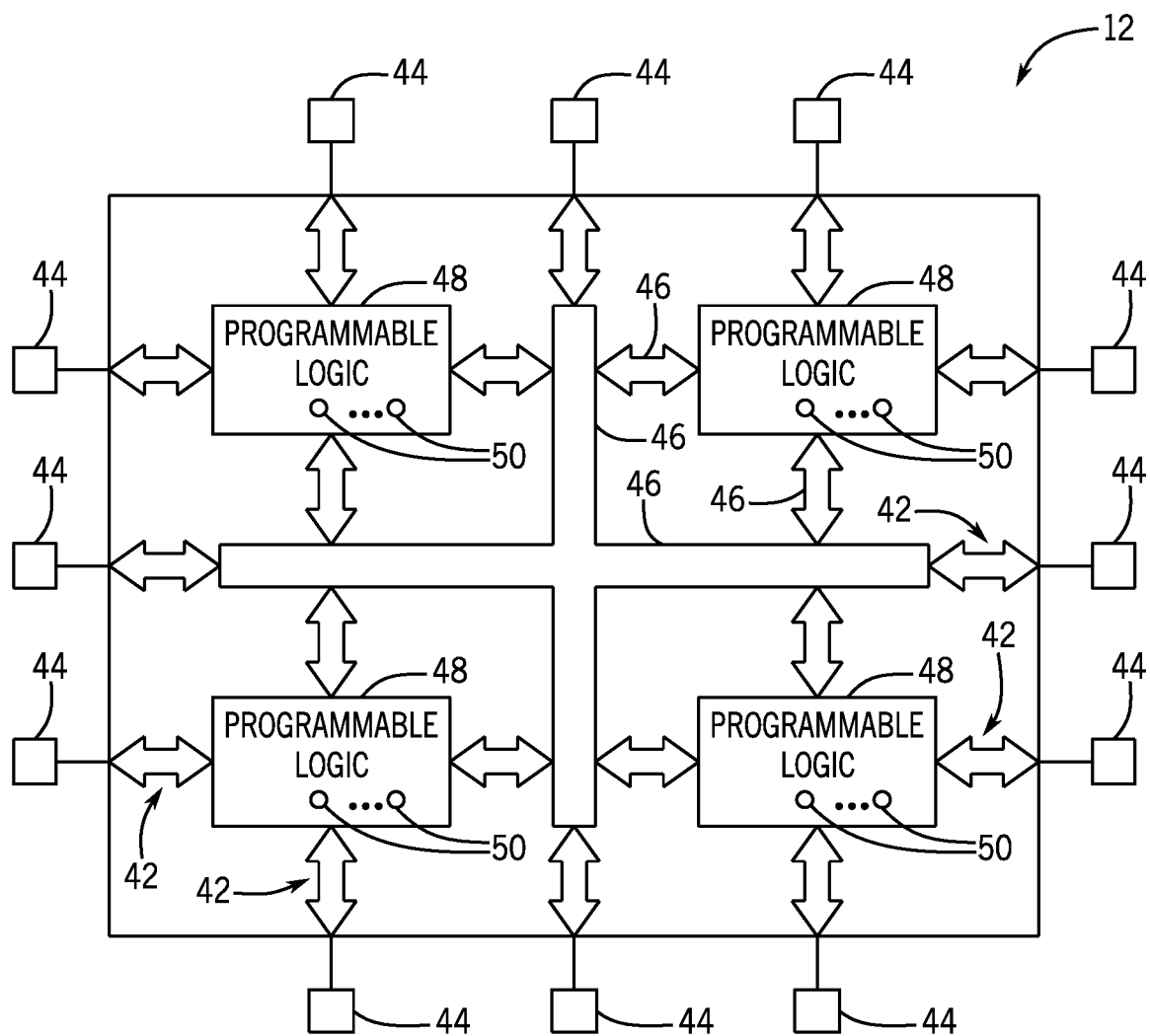
FIG. 2 is a block diagram of the integrated circuit of FIG. 1, in accordance with an embodiment.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). As shown, integrated circuit 12 may have input/output circuitry 42 for driving signals off device and for receiving signals from other devices via input/output pins 44. Interconnection resources 46, such as global and local vertical and horizontal conductive lines and buses and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit 12, may include programmable elements 50 with the programmable logic 48. For example, as discussed above, a designer (e.g., a customer) may (re)program (e.g., (re) configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the discussion of FIG. 1 and FIG. 2 in mind, a user (e.g., designer) may utilize the design software 14 to implement the logic block 26 on the programmable logic 48 of the integrated circuit 12. In particular, the designer may specify in a high-level program that mathematical operations such as addition and multiplication be performed. The compiler 16 may convert the high-level program into a lower-level description that is used to program the programmable logic 48 to perform addition.

Figure 3:
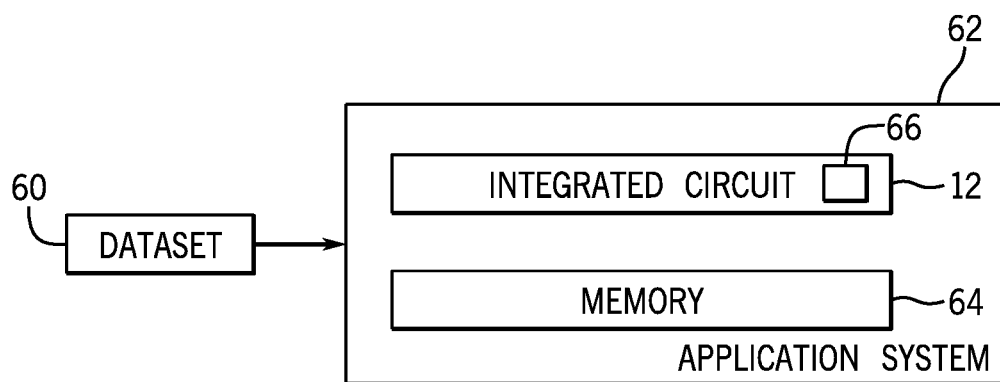
FIG. 3 is a block diagram of an application system that includes the integrated circuit of FIG. 1 and a memory, in accordance with an embodiment.

Once programmed, the integrated circuit 12 may process a dataset 60, as is shown in FIG. 3. FIG. 3 is a block diagram of an application system 62 that includes the integrated circuit 12 and memory 64. The application system 62 may represent a device that uses the integrated circuit 12 to perform operations based on computational results from the integrated circuit 12, or the like. The integrated circuit 12 may directly receive the dataset 60. The dataset 60 may be stored into the memory 64 before, during, or concurrent to transmission to the integrated circuit 12.

As bandwidths and processing expectations increase, such as in response to the advent of fifth generation (5G) and higher communication techniques and/or widespread use of neural networks (e.g., machine learning (ML) and/or artificial intelligence (AI) computations) to perform computations, the integrated circuit 12 may be expected to handle subsequent increases in size of the dataset 60 over time. The integrated circuit 12 may also be expected to perform digital signal processing operations of signals transmitted using 5G or higher techniques (e.g., signals of higher throughput and/or high data transmission bandwidths) and ML operations. These desired applications may also be implemented dynamically, during runtime, such as during a partial reconfiguration that causes configuration of a portion of the integrated circuit 12 without causing configuration of another portion of the integrated circuit 12 during runtime operations of the integrated circuit. For at least these reasons, it may be desired to improve configuration methods to meet complexity and timing specifications of technical computations. To do so, programmable logic 66 that includes at least the programmable logic 48, the input/output pins 44, and interconnection resources 46, may leverage a 1-bit data register to (re)configure the programmable logic 48 using mircosectors. Using microsectors to program circuitry functions in the programmable logic 48 may provide the advantages of enabling write-only reconfiguration, relatively smaller region SEU detection (e.g., 1-bit region of detection), relatively smaller granularities for reconfiguration regions, and relatively larger parallel configuration (e.g., parallel configuration of data channels of 1-bit width) operations. As used herein, the term microsector refers to a sector of programmable logic that has a data register that is comparatively small. In one example, a microsector has a 1-bit data register. In some embodiments, a microsector may have a larger data register, but still may be smaller than what is ordinarily found in a sector (e.g., may be less than 32 bits, less than 16 bits, less than 8 bits).

Figure 4B:
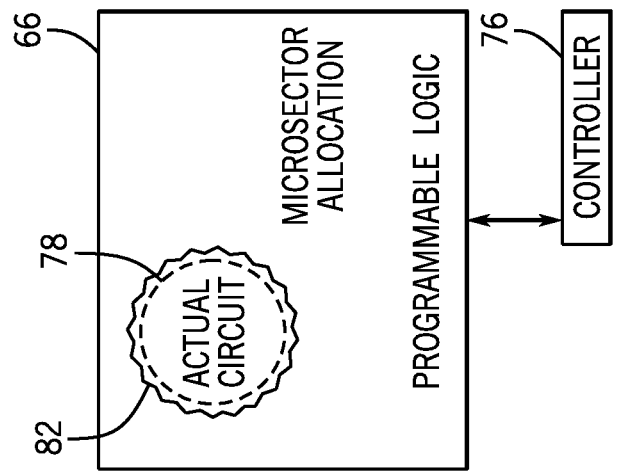
FIG. 4B is a block diagram of programmable logic of the integrated circuit of FIG. 1 implemented using microsector allocations, in accordance with an embodiment.
Figure 4A:
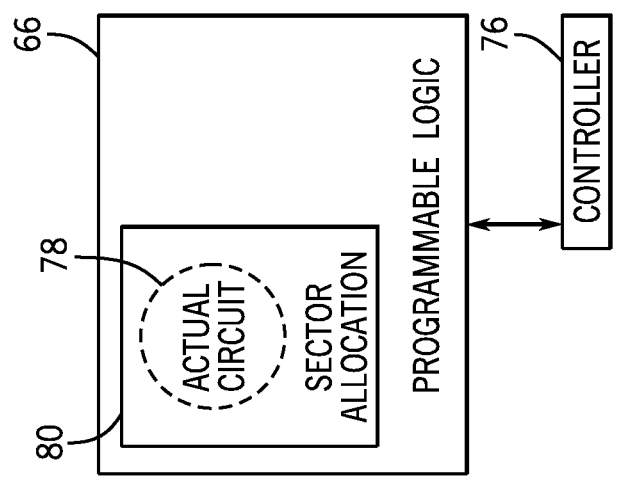
FIG. 4A is a block diagram of programmable logic of the integrated circuit of FIG. 1 implemented using sector allocations, in accordance with an embodiment.

To elaborate regarding the smaller granularities for reconfiguration regions, FIG. 4A is a block diagram of example programmable logic 66. The programmable logic 66 may include a controller 76 to program the programmable logic 66. When programmed, the circuitry of the programmable logic 66 may be used to perform digital signal processing, machine learning processing, computations, logic functions, or the like (e.g., represented by portion 78). However, the programmable logic 66 may be divided in relatively large logical sectors, and thus a portion 80 may be allocated to the circuitry as opposed to a region of circuitry corresponding to the portion 78. This overallocation of resources may waste circuitry since size differences between the portion 80 and the portion 78 represent underutilized programmable logic 66. It is noted that when partially reconfiguring programmable logic 66, certain speed metrics may be desired to be met (e.g., partial reconfiguration may be desired to be completed in a relatively fast amount of time). In these cases, for example, overallocation of resources may occur since slower configuration speeds may be undesired that may improve allocation of resources.

Indeed, if a device is built in the programmable logic of a multiple of sectors, the device may likely have more or less logic (e.g., logic arithmetic blocks (LABs), digital signal processing (DSP) blocks) than is desired to be allocated to building the device. This overallocation may occur since a rectangular number of sectors is used to implement the example device. By rearranging the interconnections and/or shrinking a data width of data registers to form microsectors, a relatively more exact amount of logic (e.g., more accurate number of LABs or DSP blocks) may be allocated to implementation of the device.

When implementing circuitry represented by the portion 78 in programmable logic 66 that uses microsector logical divisions, as shown in FIG. 4B, less programmable logic 66 may be wasted when implementing the circuitry. FIG. 4B is a block diagram of the programmable logic 66 implemented using microsectors. Indeed, microsectors may permit the circuitry corresponding to the portion 78 to be implemented in a region represented by portion 82. Although not drawn to scale, the portion 82 implementing circuitry corresponding to the portion 78 efficiently utilizing the programmable logic 66 where the portion 80 implementing the portion 78 may otherwise inefficiently utilize the programmable logic 66.

To elaborate further on a microsector architecture, FIG. 5 is a block diagram of the programmable logic 66. The programmable logic 66 may couple between microsectors 92 using the interconnection resources 46. Indeed, the interconnection resources 46 may include any suitable combination of data shifting registers, registers, logical gates, direct couplings, reprogrammable circuitry, or the like able to be used to move data from a first location to a second location within the programmable logic 66 and/or within the integrated circuit 12. One or more microsectors 92 may be programmed by the controller 76 with information to perform functions of circuitry, such as the circuitry corresponding to portion 78. However, since the controller 76 may transmit configuration data (or any suitable data), the granularity of regions used to program functions into the programmable logic 66 may reduce. When these granularities reduce or become more precise (e.g., smaller), programming of the programmable logic 66 may improve since circuit designs may be more efficiently configured in the programmable logic 66. It is noted that the programmable logic 66 and/or the integrated circuit 12 may be any suitable type of software or hardware, or a combination of the two. The integrated circuit 12 and/or the programmable logic 66 may be or include programmable logic 48, programmable elements 50, or the like, to enable one or more portions to be reprogrammable (e.g., reconfigurable). The controller 76 may interface with the microsectors 92 using the interconnection resources 46 that may include interface buses, such as an advanced interface bus (AIB) and/or an embedded multi-die interconnect bridge (EMIB). As described above, the programmable logic 66 may be a reprogrammable circuitry capable of performing a multitude of tasks.

Figure 6:
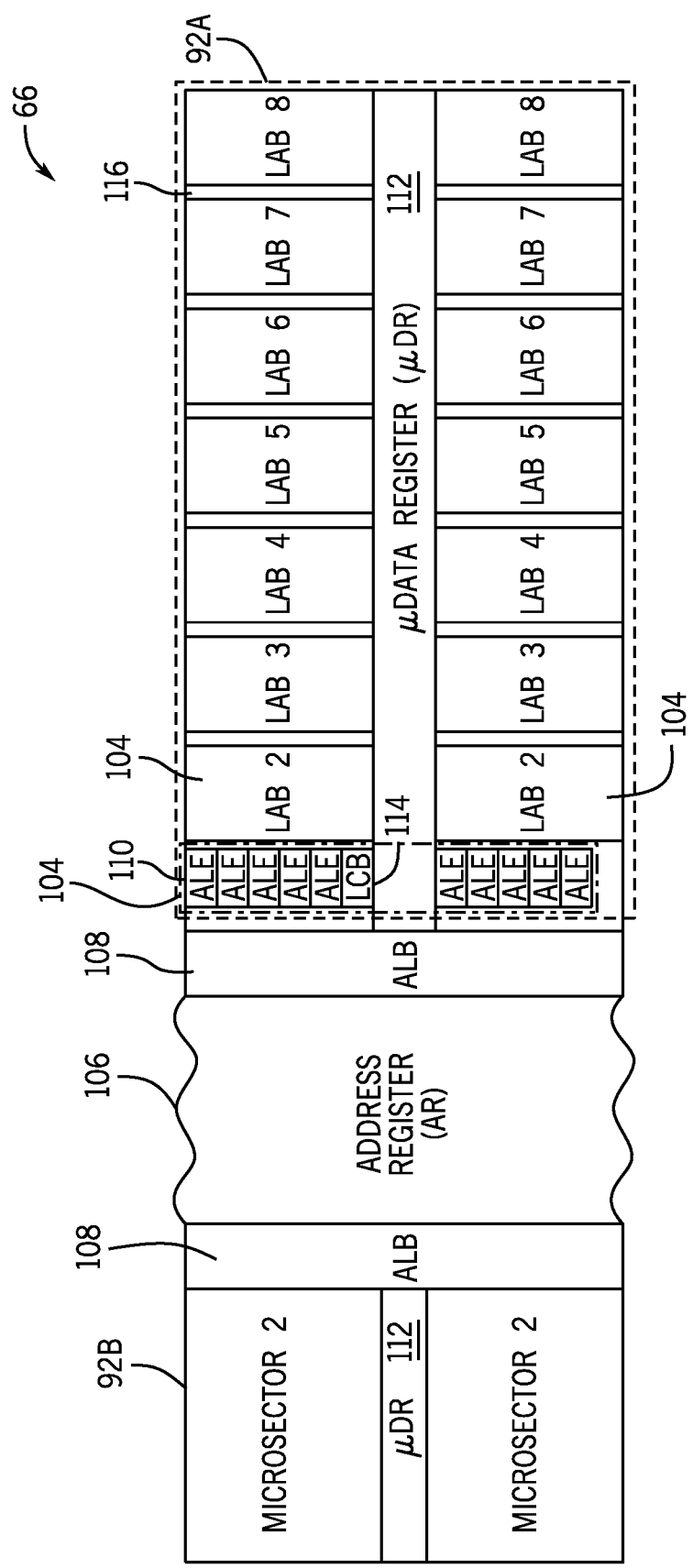
FIG. 6 is a block diagram of a microsector of the programmable logic of FIG. 5, in accordance with an embodiment.

FIG. 6 is a block diagram of two example microsectors 92 (e.g., microsector 92A, microsector 92B). This application describes a particular architecture of microsectors 92, however it should be understood that any suitable architecture may be used. Indeed, each microsector 92 may include one or more logic access blocks (LAB) 104 (e.g., eight LABs) able to interface with the interconnection resources 46 (shown here to communicate with the microsectors 92 via an address register 106 (AR)). Indeed, the interconnection resources 46 may include one or more ARs 106 to transmit and/or receive signals from the microsectors 92, as well as or in alternative of other control circuitry, logic circuitry (e.g., AND gates, OR gates, not-OR gates, exclusive-OR gates, flip-flops, switch-reset (SR) latches), or the like. It should also be understood that same or similar circuitry may be included in each microsector 92.

The LABs 104 may receive data from the AR 106 through an address line buffer (ALB) 108. The ALBs 108 may each include digital signal processing (DSP) circuitry and/or control circuitry that converts data from a suitable format for transmission to the microsector 92A to a suitable format for use by circuitry of the LAB 104.

Each LAB 104 may include some number of arithmetic logic element circuitry (ALE) 110 circuits (e.g., ten ALEs 110). A micro-data register (µDR) 112 may be disposed on at least some of the ALEs 110, such as in another layer of silicon, or other material, used to physically form the integrated circuit. The µDR 112 communicatively couples each LAB 104 to the ALB 108. Each ALE 110 of the LAB 104 may share and/or couple to the LAB-wide Control Block (LCB) 114. The LABs 104 are separated from each other by routing fabric 116 (e.g., configuration random access memory (CRAM), configuration memory). In this example, the µDR 112 runs through the LCB 114 via a center of a row of circuitry corresponding to the microsector 92A.

Figure 7:
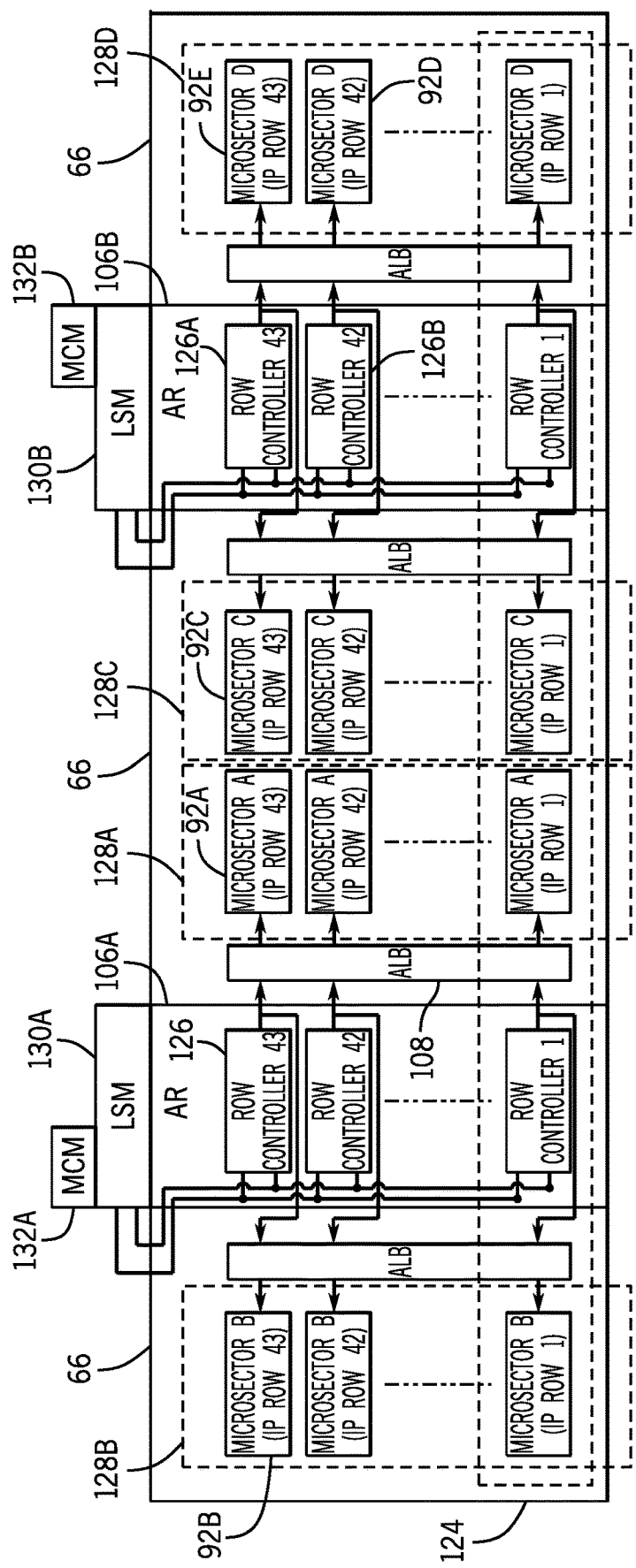
FIG. 7 is a block diagram of a portion of the programmable logic and at least some control circuitry for the portion of the programmable logic, in accordance with an embodiment.

To elaborate further on interconnections between the AR 106 and the microsectors 92, FIG. 7 is a block diagram of rows regions (row regions) 124 and row controllers 126 implemented in the AR 106 illustrating communicative couplings between the row controllers 126 and the microsectors 92 from FIG. 6. It is noted that microsectors 92 may sometimes be referred to in terms of row regions 124 since designs like manufacturer designs (e.g., manufacturer IP) or user designs (e.g., user IP) may be loaded into the microsectors 92 for implementation. The AR 106 may include any suitable control system circuitry and/or logic circuitry. Indeed, the AR 106 may be an address register from INTEL® STRATIX 10® or INTEL® AGILEX® by INTEL CORPORATION. Furthermore, the AR 106 is shown as disposed between at least two microsectors 92, however there are some instances where the AR 106 may be disposed by just one column region 128 of microsectors 92 (e.g., orientated on the right side of the AR 106 or on the left side of the AR 106) to accommodate physical boundaries of the programmable logic 66 or the integrated circuit 12 or to avoid supporting left and right data movement patterns. The various row regions 124 and column regions 128 are arranged as a grid on a same physical board.

Each row controller 126 may control a row region 124 of microsectors, and thus be associated with or be the ALB 108 described earlier. For the microsector implementation, the AR 106 may be repeated and shared between column region 128 (e.g., column region 128A, column region 128B, column region 128C, column region 128D) of microsectors 92. For example, column region 128A shares an AR 106A with the column region 128B, and is disposed adjacent to a column region 128C. The microsectors 92 of the column region 128C may share the AR 106B with microsectors 92 of the column region 128D. Thus, the microsectors 92 of column region 128C may be controlled using signals generated and/or transmitted by the row controllers 126 of the AR 106B independent of at least some signals transmitted via the AR 106A. Although part of a same row region 124, the microsector 92C may be controlled differently from the microsector 92B since the microsectors 92 being associated with different column region 128. Furthermore, although part of a same column region (e.g., column region 128C), the microsector 92C may be controlled differently from the microsector 92D since the microsectors 92 receive control signals from separate row controllers 126 (e.g., row controller 126A, row controller 126B). Microsectors 92 may be formed to divide the row region 124 into smaller portions, and thus provide the smaller granularity.

The row controllers 126 may use any suitable communication protocol to transmit and/or receive signals from respective microsectors 92. For example, the row controllers 126 may use a streaming protocol, such as AXI 4 Streaming, to receive an address and data corresponding to the address in a same symbol (e.g., same packet transmission) at internal write registers (e.g., internal to a respective row controller 126).

Each AR 106 may include a local sector manager (LSM) 130 (e.g., LSM 130A, LSM 130B) at the bottom or top of the AR 106 column region. For example, the LSM 130A is shown at the top of and communicatively coupled to the AR 106A column region. The LSM 130A is also disposed outside of the programmable logic 66. As shown, one LSM 130 may be included per AR 106, however it should be understood that LSMs 130 may be shared by two or more AR 106, such that one LSM 130 controls two or more AR 106.

Sometimes, the LSMs 130 may be integrated with an AR column manager (CM) 132 (e.g., CM 132A, CM 132B) to form a respective sector column managers (SCM). The CMs 132 may be responsible for managing transactions between its corresponding AR 106 and the interconnection resources 46. For example, the CM 132A may coordinate with the LSM 130A to transmit a command to the microsector 92A and the microsector 92B. The CM and LSMs 130 may be involved with routing commands, such as configuration instructions, to certain microsectors 92 from other portions of the integrated circuit 12 or from other microsectors 92. In cases where the interconnection resources 46 involve use of a network-on-chip, the CMs 132 may manage transactions between the network-on-chip and the corresponding AR 106. This arrangement may permit relatively high bandwidth data movement between master and slave bridges implemented via the interconnection resources 46 since, for example, the CMs 132 may help coordinate transmission between multiple microsectors and/or multiple ARs 106, such that the transmissions may be paralleled, or at least partially coordinated in time and/or in sequence.

A controller, such as the controller 76, may transmit packets to each of the LSMs 130 and/or CMs 132 that include data and commands to perform a configuration and a test of the configuration. To implement the configuration, one or more LSMs 130 may generate respective commands interpretable by respective row controllers 126, where the respective commands may be used to control configuration of one or more microsectors 92. The data and commands transmitted to a LSM 130 from the controller 76 may correspond to a portion of a circuit design represented by the configuration to be implemented in the subset of microsectors 92 managed (e.g., communicatively coupled) to the respective LSM 130. Once the configuration is implemented in the programmable logic 66 (or at least partially implemented), the one or more LSMs 130 may test the implemented configuration to verify that the configuration operates as expected. The test may be performed using a portion of the data and commands received by the LSM 130 from the controller 76. The LSMs 130 may test the respective portion of the circuit design corresponding to its respective intersections of column regions 128 and row regions 124 at least partially overlapping in time to the programming (e.g., configuration) of additional portions of the programmable logic 66, such as while one or more other row regions 124, column regions 128, or microsectors 92, continue to be programmed (e.g., configured). Once each portion of the programmable logic 66 is programmed, the LSMs 130 may coordinate in operation and perform a system-wide test of one or more circuit designs implemented in one or more microsectors 92. Testing performed may include aggregation operations that verify how portions of circuitry operate in addition to verifying how a whole circuit operates. Each LSM 130 may operate as a management engine for its local set of the microsectors 92.

Indeed, each row controller 126 may receive a command from its corresponding LSM 130 and may decode the command to generate control signals. The control signals may control operation of the corresponding row region 124 of microsectors 92. For example, the row controller 126A, coupled between the microsector 92C and the microsector 92E, may generate control signals used for controlling operation of the microsector 92C and the microsector 92E disposed in a same row region 124. Furthermore, as opposed to the LSM 130 controlling multiple column regions 128, each LSM 130 may control two columns regions 128.

For example, the LSM 130 may generate commands associated with read and write operations. In some cases, the LSM 130 may also command the row controller 126 to decompress (e.g., decode) data associated with the command before transmitting data to a respective microsector 92. The row controller 126 may be considered a configuration endpoint that may be read and/or written to by the LSM 130 and/or the controller 76 via the interconnection resources 46 to read or write data (e.g., configuration data, test data) to the microsector 92. It is noted that although shown as including 43 row regions 124, and 43 row controllers 126, any suitable number of row regions 124, column regions 128, and the like may be used in the integrated circuit 12 to implement systems and methods described herein.

Figure 8:
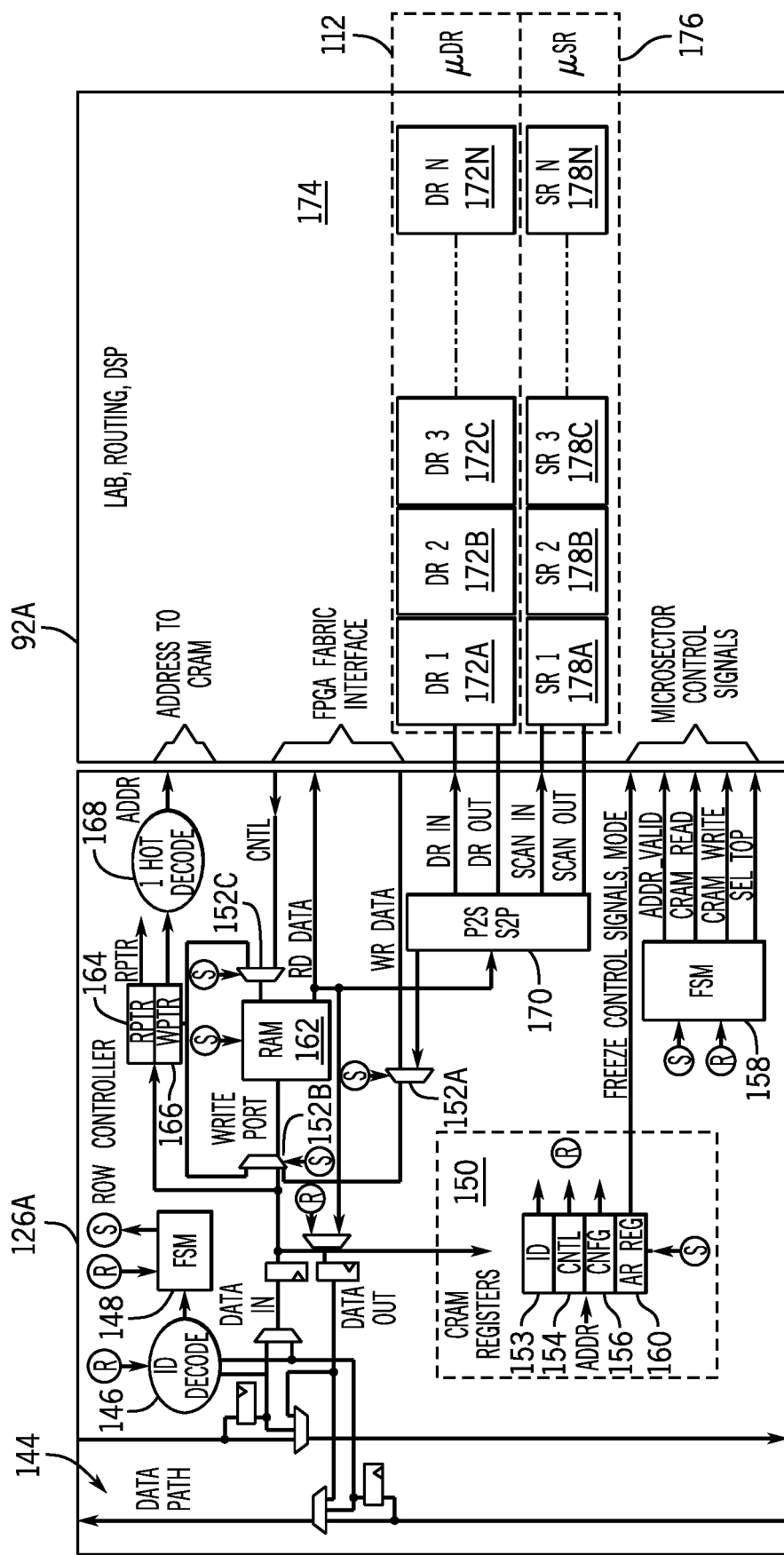
FIG. 8 is a block diagram of a row controller and the microsector of FIG. 6, in accordance with an embodiment.

To elaborate further on accessing the microsector 92, FIG. 8 is a block diagram of a respective row controller 126 and of a respective microsector 92. For ease of explanation, row controller 126A and microsector 92A are referenced. However, it should be understood that these descriptions are applicable to each row controller 126 and/or microsector 92.

The row controller 126 may receive the command from the LSM 130 via data path 144. Indeed, the LSM 130 may transmit commands as one or more packets (e.g., data packets) using the data path 144. An identifier decoder (ID Decode) block 146 may decode an identifier (ID) of the packet. By reading the ID of the packet, the ID Decode block 146 may identify whether the packet is relevant to the row controller 126A and/or whether the packet is intended to be received by the row controller 126A. The data path 144 may be shared by each row controller 126 of a respective AR 106. As such, the data path 144 may also continue on to a subsequent row controller 126 of the AR 106A.

When the ID Decode block 146 identifies that a packet is for the row controller 126A, a finite state machine (FSM) 148 may perform logical sequencing to move the packet off of the data path 144. Register values received from the packet may be stored in configuration random access memory (CRAM) registers 150. It is noted that the CRAM registers 150 may be alternatively implemented in flip-flop circuitry or other logic circuitry, however CRAM-based registers may provide suitable memory storage capabilities to flip-lop circuitry or other logic circuitry while using a smaller footprint.

Register values may be referenced by other components throughout the row controller 126A. For example, from the packet, the FSM 148 and/or the ID Decode block 146 may receive signals indicative of register values (R). In response to the register values, the FSM 148 may generate a signal indicative of a state machine state (S). The state machine state may maintained by the FSM 148, where a state of an FSM of the FSM 148 may change in response to the register values (R) received from the CRAM registers 150 and/or in response to an output from the ID Decode block 146. The FSM 148 may output the state machine state (S) to the CRAM registers 150. The switching circuitry may change state to change a data path internal to the row controller 126A in response to the state machine state (S) output from the FSM 148.

Some of the CRAM registers 150 may not change in response to the packet being received by the row controller 126A. For example, identifier data stored in a controller identifier (ID) register 153 may be set at a time of initial configuration of the row controller 126A. However, if the row controller 126A is not preset with the identifier data stored in the ID register 153, the row controller 126A may set a value of the ID register 153 (e.g., the stored identifier) to an identified included in the packet.

The CRAM registers 150 may include a control (CNTL) register 154 that stores control bits. The control bits may define how the row controller 126A interacts with the data path 144, such as how the row controller 126A is to receive and/or access a packet from the data path 144. For example, the control bits may indicate to the ID Decode block 146 which subset of packets are relevant to the row controller 126A and thus should be taken off of the data path 144. The CRAM registers 150 may also include a configuration (CNFG) register 156 used to store configuration bits. The configuration bits may transmit to the FSM 148 and/or FSM 158 to change an operation of the row controller 126, such as an operation performed based on a state of the FSM 148 and/or the FSM 158. An AR register 160 may store configuration bits set by the AR 106 (e.g., AR 106A), for example to define an operation for one or more of the row controllers 126.

The state machine state (S) generated by the FSM 148 may be received by the FSM 158. Thus, the state of the FSM 158 may be based on the state of the FSM 148. The FSM 158 may use the state machine state (S) and/or the received register values (R) to manage sequencing used to perform read operations to read a CRAM of the microsector 92A, write operations to read the CRAM of the microsector 92A, read operations to read a user register of the microsector 92A, write operations to write the user register of the microsector 92A, and/or to perform SEU detection operations to detect errors in programming of the microsector 92A.

In some cases, a random-access memory (RAM) 162 of the row controller 126A may also receive the state machine state (S) generated by the FSM 148. The RAM 162 may be used as storage for the configuration operations. Since the RAM 162 includes volatile memory, the storage provided via the RAM 162 may be temporary storage. Packets from the data path 144 and/or packets to be transmitted to the data path 144 may be stored temporarily in the RAM 162 before and/or after transmission via the data path 144. Operations used to read from the RAM 162 may be based on data indicated by a Read Pointer (RPTR) block 164. Operations used to write to the RAM 162 may be based on data indicated by a Write Pointer (WPTR) block 166. The pointer indicated by the data of the RPTR block 164 may be used to advance an address provided to the RAM 162 as data is read from the RAM 162, thereby providing real-time adjustment of pointers used to access data stored by the RAM 162. It is noted that in cases when the RAM 162 is not included in the row controller 126A, supporting circuitry may also be omitted. For example, without the RAM 162, some switching circuitry (e.g., 152B, 152C) may be omitted as well as some or all of the FPGA fabric interface control signals since the data loading may be performed via transmit through the μDR 112. In some cases, the FSM 148 may control the addresses indicated by the RPTR block 164 and/or the WPTR 166 when moving data to or from the data path 144 and/or the FSM 158 may control the address indicated by the RPTR block 164 and/or the WPTR 166 when moving data to or from microsector 92A.

The row controller 126A may convert the address indicated by the WPTR block 166 to a one hot-decoded value (e.g., thermometer encoded value, 10000000, 00000001) by using a decoder block 168 (1 hot decode). The one-hot encoded value may be used to select a CRAM to be written or read. It is noted that with one-hot encoded values, an integer value, such as an address or another integer encoded variable, may be replaced (e.g., translated) into a new binary variable, where a binary value (e.g., logical low bit, "0" or a logical high bit, "1" as is in the case of 111110 encoding) may added for each unique integer value. In this way, an address of ten may be represented by "0000000001" or "1111111110," while an address of four may be represented by "0001" or "1110," based on whether the encoding is using a "1" or a "0" to represent the various integer values. Other formats may be used based on the particular system implementation.

The row controller 126A may also include a parallel-serial converter block 170 (P2S S2P). The parallel-serial converter block 170 may change a format of the data from parallel to serial, and vice versa, such that the data may be serially shifted to and/or from the μDR 112 that may include individual data registers 172 (e.g., data register (DR) 172A, DR 172B, DR 172C, DR 172N) serially coupled.

Each DR 172 may include any suitable combination of logic gate circuitry and/or serially shifting circuitry. For example, the DR 172A may include one or more flip-flops, SR latches, multiplexing circuitry or the like to enable the row controller 126A to shift data in and/or out of the respective programmable logic 66 (e.g., disposed in region 174) associated with the microsector 92A. Indeed, the region 174 of the programmable logic 66 corresponding to the microsector 92A may include the LABs 104, the ALEs 110, the LCBs 114, and/or the routing fabric 116 described above with regards to at least FIG. 6.

The microsector 92A may sometimes include a scan register (μSR) 176. The μSR 176 may be of any suitable data width, and is shown as a 1-bit wide register. Indeed, the μSR 176 may include one or more scan registers 178 (e.g., scan register (SR) 178A, SR 178B, SR 178C, SR 178N). The row controller 126A may use the SRs 178 to scan data in and out of the user registers (e.g., DRs 172) to test functions programmed into the region 174 of the programmable logic 66, as is elaborated on in FIG. 11.

It is noted that the command received via the data path 144 may be of any suitable format or length. One example format is shown in FIG. 9.

Figure 9:
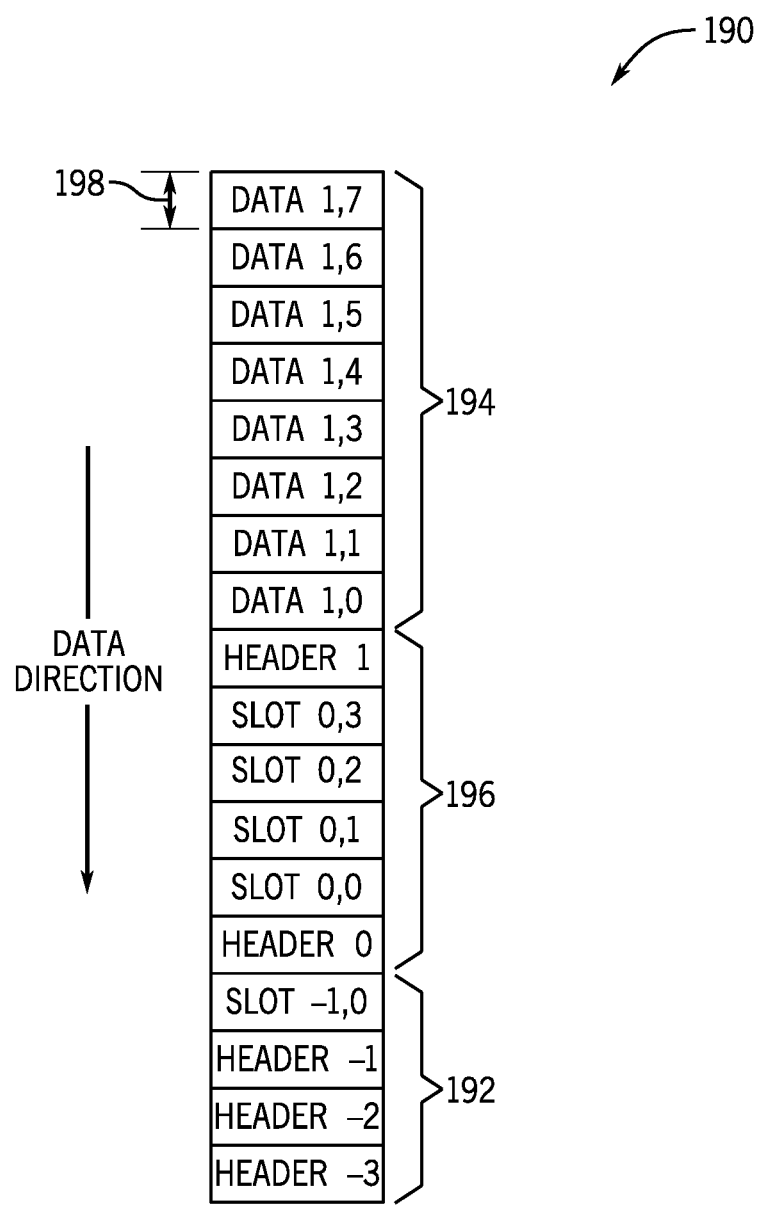
FIG. 9 is an illustration of a data packet used to control operations of the row controller of FIG. 8, in accordance with an embodiment.

FIG. 9 is an illustration of an example command transmitted to the row controllers 126. Sometimes a packet 190 transmitted via the data path 144 is shown as a streaming data packet, as opposed to a directly transmitted data packet. In this way, each row controller 126 of an AR 106 may monitor the data path 144 and identify from the packet 190 transmitted itself whether the packet 190 is relevant to operation of the respective row controller 126 (e.g., is meant for the respective row controller 126). Streaming data packets 190 may be sent using a protocol like Avalon Streaming or AXI 4 streaming.

The packet 190 is shown as including a header 192, write data 194, and slots 196 for read data. The packet 190, and thus each of the header 192, write data 194, and slots 196, may be made of portions of data 198 that respectively correspond to 1 word or 16 bits or 2 bytes, however these sizes may be configurable based on the particular implementation and/or the particular protocols being used to transmit the packet 190. The header 192 of the packet 190 may describe an address of a targeted row controller 126 and an operation to be performed by the targeted row controller 126. The address indicated by the header 192 may identify the targeted row controller 126 in a way interpretable by the different row controllers 126, such that the targeted row controller 126 may identify when the packet 190 is intended for itself (e.g., via the header 192 including its own address or matches at least a portion of an identifier for the targeted row controller 126). For example, a first row controller 126 may access the header 192 to determine whether the header 192 identifies it as the targeted row controller 126. When the header 192 identifies the first row controller 126 (e.g., a match between identifiers occurs), the first row controller 126 may shift the data packet 190 from the data path 144 (e.g., shared data path 144) for completion of the instructed operation (e.g., command). However, when the header 192 identifies another row controller 126, the first row controller 126 may return the packet 190 to the data path 144 such that the packet 190 may transmit on to another, or subsequently coupled row controller 126 disposed downstream of the data path 144 relative to the row controller 126. Subsequent portions of the data packet include the write data 194 and/or slots for the read data to be included in the packet 190 for return transmission to the controller 76, the LSM 130, and/or the CM 132, or other suitable circuitry.

The header 192 itself may include the command. For example, different headers 192 include different commands and different amounts of additional data to support execution and/or instruction of the different commands. Sometimes the header 192 includes a command that is encoded, such as by using 8 bits of command encoding. Encoding commands may provide expansion of functionality and/or increase an amount of information included in the header 192 to command the targeted row controller 126 by compressing data indicative of commands into a smaller size. More or less bits may be used to perform the command encoding. For example, some headers 192 may instruct a register write command, while other headers 192 may instruct a write data command and/or a read slot command. The component generating the packet 190 may include unallocated command space to reserve a slot for other intercepting devices to add in a command to the header 192, such as at a later time but prior to transmitting via the data path 144.

In some cases, the targeted row controller 126 receives an asserted end-of-packet signal that indicates that a symbol (e.g., portion of data) is a last symbol of a packet. The end-of-packet signal may be generated and transmitted by the controller 76, the LSM 130, and/or the CM 132, or other suitable circuitry to the row controller 126. In some cases, the targeted row controller 126 may access a packet length parameter and track (e.g., using a counter) a number of symbols received to determine when a symbol is a last symbol of a packet.

The register write command indicated by the encoded command corresponding to the header 192A may configure the targeted row controller 96 as well as request a read operation to occur (e.g., instruct a read operation). The register write command of the header 192A may be considered a single cycle message that includes immediate data to be written to a register of the row controller 126 (e.g., one or more of the CRAM registers 150). One of the key register write messages is a read request that permits a read of data stored at the register address.

Figure 10:
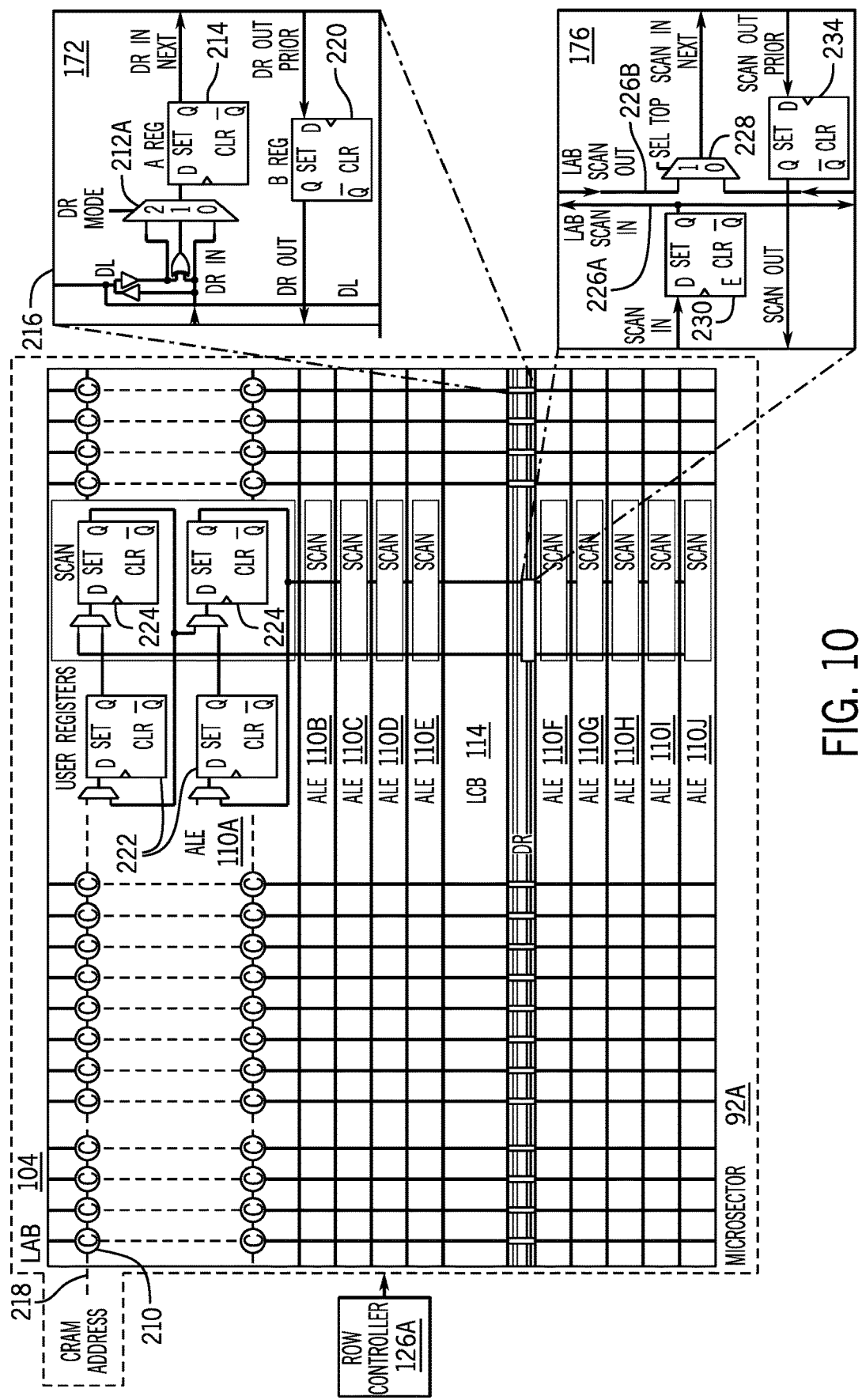
FIG. 10 is a block diagram of the row controller and the microsector of FIG. 8, in accordance with an embodiment.

To elaborate further on operations of the microsector 92A, FIG. 10 is a block diagram of the microsector 92A and the row controller 126A. FIG. 10 illustrates a respective LAB 104 of the microsector 92A from a configuration perspective, however it should be understood that there may be many additional functions of the LAB 104 not particularly shown or described herein. It is noted that the LAB 104 includes the ALEs 110 and the LCB 114, and the microsector 92A includes the DR 172 and the SR 178 separate from the LAB 104 but interconnected to the ALEs 110 and/or to the LCB 114.

Components of the LAB 104 may interface with configuration memory, such as configuration RAM (CRAM) 210 (C), or the portion of the programmable logic 66 able to be configured during (re)configuration operations (or partial reconfiguration operations). The microsector architecture may support two classes of operations—CRAM operations and User Register operations. The CRAM operations may be supported by logic controlling the μDR 112 while the User Register operations may be supported by logic controlling the μSR 176.

The μDR 112 may operate in a variety of operational modes at least in part by setting the operational mode across each of the DRs 172. For example, switching circuitry 212A may be used to control which operational mode the respective DRs 172 are operated. The μDR 112 may operate in a CRAM write mode (e.g., example write sequence) when the switching circuitries 212 are each set to "0." That is, when each respective DR 172 is to mode "0," the CRAM write data is permitted to be shifted through a DR A register 214. The DR A register 214 may include a flip-flop that serially couples to additional flip-flops, where each of the DRs 172 may include another of the DR A registers 214. A write signal (not shown) may permit a data line (DL) 216 to be driven with data from the DR A register 214. An address line 218 (CRAM address) of the row of CRAM 210 that is to be written may be asserted while the μDR 112 is operated in the CRAM write mode, permitting data to be written into the address CRAM frame. As a reminder, the address written to the address line 218 may be a an address represented in a one-hot decoded value (e.g., 00001, 10000, 001), thereby enabling a single logical high bit to be used to select which of the CRAM 210 for the particular write (or read operation as described below).

The µDR 112 may sometimes operate in a CRAM read mode (e.g., example read sequence) when the switching circuitries 212 are each set to "2." That is, when each respective DR 172 is set to mode "2," a read signal may permit the DL 216 to be driven with data from selected CRAM 210. A portion of the CRAM 210 may be selected using the address line 218. For example, the address line 218 of the row of the CRAM 210 that is to be read may be asserted, causing that CRAM frame of data to be driven onto the DL 216. Read data from the selected row of the CRAM 210 is output to the DL 216 and loaded into the DR A registers 214. At the end of the microsector 92A row (e.g., when the data has shifted down to DR 172N shown in FIG. 8), the DR In Next Signal from the DR A register 214 is coupled to the DR Out Prior signal path (e.g., input into the DR B register 220), permitting the data from the selected CRAM 210 to be shifted back to the microsector 92A. It is noted that the DR In Next Signal path and/or the DR Out Prior signal path may be 1-bit wide, or any suitable data width wide. In this way, read data may be transported from the selected CRAM 210 to the microsector 92A by way of at least a portion of the DR A register 214 and at least a portion of the DR B register 220 (e.g., at least one flip-flop of each).

The µDR 112 may yet, at another time, operate in another operational mode, a CRAM SEU detect mode (e.g., example sequence) when the switching circuitries 212 are each set to "1." That is, when each respective DR 172 is to mode "1," a current read CRAM 210 value may be XOR'd with data from one or more prior CRAM columns shifted read data before being loaded into the DR A register 214.

The microsector 92A may also include a scan register (OR) 176, for example, to be used to perform design verification operations or verification operations. The µSR 176 is shown as a 1-bit wide register. Indeed, the µSR 176 may include one or more SRs 178. The SRs 178 may be used to scan test data in and out of the user registers (e.g., DRs 172) from the RAM 162 to test functions programmed into the region 174 of the programmable logic 66, as introduced in FIG. 8. Indeed, user data (e.g., implementation data) may be shifted through either of the top set of the ALE 110s (e.g., ALE 110A through ALE 110E) user registers 222 and scan flip-flops 224 or through the bottom set of the ALE 110s (e.g., ALE 110J through ALE 110F) user registers 222 and scan flip-flops 224 via data paths 226 (e.g., LAB Scan In data path 226A, LAB Scan Out data path 226B).

When in a scan mode, a scan chain is formed from the µDR 112 up through the top-most scan flip-flop 224 and then down through each scan flip-flop 224 back to the µDR 112. The mux on the D input of the scan flip-flop 224 for the ALE 110A at the top of the LAB 104 receives the scan input from the µDR output (e.g., LAB Scan In data path 226A). SCAN blocks between the top-most ALE 110A row and the µDR 112 receive a scan input into the mux on the LAB Scan In data path 226A from the ALE 110 row disposed above it.

For example, to perform verification operations, test data may be shifted into the top set of ALEs 110 (e.g., ALE 110A through ALE 110E) before being shifted into the bottom set of ALEs 110 (e.g., ALE 110J through ALE 110F). Toggling between which of the ALEs 110 may occur via switching circuitry 228, that receives a "select top" (SEL TOP) control signal, such as from the controller 76, the row controller 126, the CRAM register 150, or the like. This process may be repeated for each microsector 92 until each microsector 92 has each µSR 176 is loaded. In some cases, the process is repeated at least partially in parallel. Once loaded, a scan load signal (not shown) may be asserted, such as by the controller 76, the LSM 130, and/or the CM 132 to load the scan values into the user registers 222 via the LAB Scan In data path 226A. After loading of the scan values into the user registers 22, the scan load signal is de-asserted and the user registers 222 are clocked. Values from the user registers are loaded, for one or more microsectors 92, into the corresponding SRs 178 and shifted out via the LAB Scan Out data path 226B, permitting the new values of the test data to be loaded into the user registers (e.g., ALE 110s).

When the row controller 126 includes the RAM 162, user data from the ALEs 110 may be stored temporarily in the RAM 162 while operation is verified, such as by verifying a computation result based on the test data to be as expected and/or by verifying timing to reload the SRs 178 to match an expected timing value and/or be within a threshold of difference of the expected timing value. Once the test is complete, the user data may be reloaded into the ALEs 110 from the RAM 162 using a similar data shifting process.

To elaborate further on how data is serially shifted through the µSR 176, when loading the test data into the user registers 222, a first SR 178A may receive the test data first at its flip-flop 230. The flip-flop 230 may output the data from the user registers 222 via the LAB Scan Out data path 226B to the subsequently coupled next flip-flop 230 of the second SR 178B. This may repeat until the user data from the user registers 222 reaches the flip-flop 230 of the last SR 178N. The user data from the user registers 222 is clocked to flip-flop 234 since the output from switching circuitry 228 (e.g., Scan In Next signal path) is coupled to the input of the flip-flop 234 in the last SR 178N (e.g., Scan Out Prior signal path), permitting the user data to be clocked back to the respective row controller 126 for temporary storage in the RAM 162, while continuing to load the test data into each of the user registers 222. It is noted that the Scan In Next signal path and/or Scan Out Prior may be 1-bit wide, or any suitable data width wide. The user data may be reloaded using a same process as used to load the test data, however the user data may be read from the RAM 162 of each respective row controller 126 for respective loading into the microsectors 92A.

To program configuration memory (CRAM 210), certain operations may take place. These operations may include sequences of write commands, read commands, and the like. For example, to initially configured the microsector 92A, the controller 76 may assign the microsector 92A a particular identifier (e.g., write command to write an identifier to the ID Decode block 146) and perform a warm reset on CRAM registers 150 of the row controller 126A for the microsector 92A. The warm reset may operate the control registers for the microsector 92A in a known safe functional state without affecting a configuration state of the circuitry of the microsector 92A and/or the row controller 126A. The controller 76 may then change a state of one or more switching circuitries (e.g., switching circuitry 152, other multiplexer circuitry) to power a CRAM power mux within the microsector 92A. The controller 76 may proceed to write redundancy and operating condition (e.g., power (P), voltage (V), temperature (T)) control settings, access control settings, authentication settings, or the like. When the microsector 92A and/or the row controller 126A is configured with the initial operational settings described above, the controller 76 may write freeze control and permit the microsector 92A to be taken out of a or put in a user mode to permit the microsector 92A to have a circuit design or a portion of a circuit design loaded into its configuration memory and/or circuitry.

Another command example is a "Write RAM contents, Read RAM contents" control sequence, such as may be used in cases when the row controller 126 includes the RAM 162. These commands may be used by the controller 76 to read or write contents of the RAM 162 to or from the data path 144 for access via the data path 144. A write to the RAM 162 may be performed to a local address (LADDR) in the RAM 162 with the data to be written being transmitted with the packet 190 via the data path 144. A read from the RAM 162 may be performed from the LADDR in the RAM 162 and the data to be read is placed in the message slots (e.g., slots 196). Similarly, reading from or writing to configuration memory (e.g., CRAM 210) and/or other circuitry (e.g., LABs 104) within the microsector 92A may be done using the same methods of data transfer to or from the data path 144 via the RAM 162. In this way, data to be written to the configuration memory may be access from the data path 144 and stored in RAM 162 before being written to the configuration memory. The reverse applies too, where data to be read from configuration memory is written to the RAM 162 before being written to the data path 144 as data stored in slots 196 of an outgoing packet 190.

Figure 11:
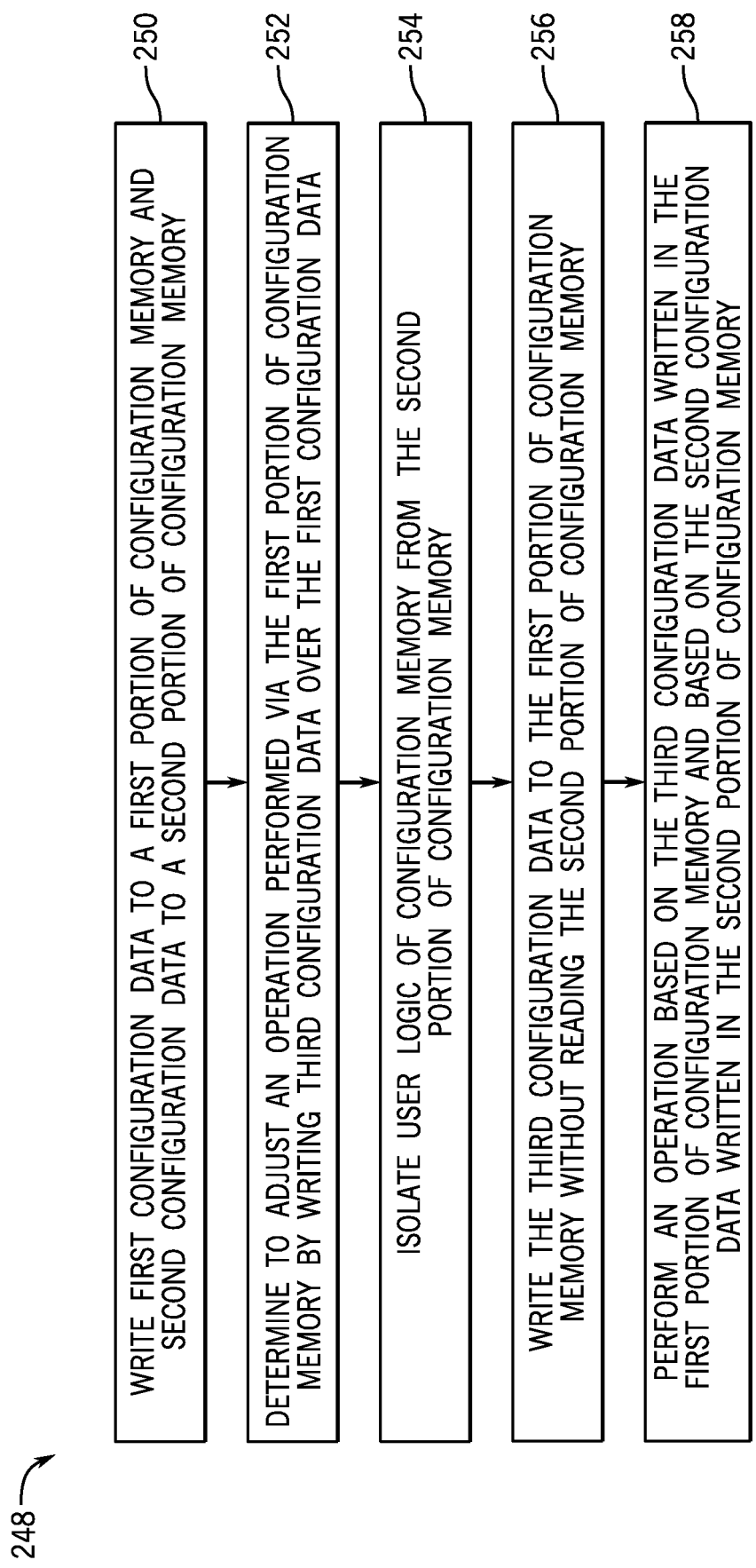
FIG. 11 is a flowchart of a method for partial reconfiguration of the programmable logic of FIG. 4B, in accordance with an embodiment.

To elaborate further on example operations of the integrated circuit 12 and its system, FIG. 11 is a flowchart of a process 248 for performing a partial reconfiguration of the programmable logic 66 having a microsector architecture. It is noted that, although depicted in a particular order, the blocks of the process 248 may not represent an exhaustive list of operations, and more or less operations may be performed and/or at least some blocks may be skipped altogether. As described herein, the process 248 is described as performed by the controller 76, however, it should be understood that any suitable processing and/or control circuitry may perform some or all of the operations of the controller 76, such as one or more of CM 132, LSM 130, or other control circuitry of the integrated circuit 12.

Furthermore, it is noted that since this process refers to partial reconfiguration of the CRAM 210, the operations of the process 248 may apply both to cases where the µSR 176 is used to access user registers 222 (e.g., generally described with reference to FIG. 10) and to cases where a quasi-delay insensitive (QDI) shift register and/or a Data In shift register are used to access user registers 222 (e.g., as will be described with reference to FIGS. 12-15).

At block 250, the controller 76 may write first configuration data to a first portion of configuration memory (e.g., CRAM 210) and may write second configuration data to a second portion of configuration memory (e.g., CRAM 210). The first configuration data and the second configuration data may be configuration data associated with implementing one or more circuit designs or computational functions into the programmable logic 66, and thus may be associated with a user circuit design and/or a circuit design to be included with a device by a provider or manufacturer of the device, or be generated by any suitable design software. After writing a configuration into the programmable logic 66, the controller 76 may determine to adjust the configuration, such as to adjust an operation performed using the programmable logic 66, to adjust a computation performed using the programmable logic 66, to add additional features to the circuit design implemented in the two portions of CRAM 210, or the like.

In response to determining to adjust the configuration, at block 252, the controller 76 may determine to adjust the operation performed via the first portion of configuration memory at least in part by writing third configuration data over the first configuration data already stored. This may be a direct write operation that does not involve a reading out and modification operation to adjust the first configuration data.

To do so, at block 254, the controller 76 may isolate user logic associated with the first portion of configuration memory from a second portion of configuration memory. Configuration memory may be reconfigured along microsector 92 boundaries, where the first portion of configuration memory may be of a first microsector 92 and where the second portion of the configuration memory may be of a second microsector 92. User logic corresponding to the first portion of configuration memory may be functionally isolated from other portions of configuration memory, including the second portion of configuration memory, by using the addressing techniques described herein to reference a specific intersection of DR 172 and CRAM 210 and/or user register 222. The addressing techniques described above, such as with reference to FIG. 10 as an example, may permit configuration memory 210 of a first ALE 110A to be referenced separately from configuration memory 210 of any other ALE 110 (e.g., ALE 110B, ALE 110C, etc.) and/or of configuration memory also included within the first ALE 110A. It is noted that no isolation operation may be used for the configuration memory 210. Microsectors may do so that by their nature. However, the functional user logic that the CRAM 210 controls may be functionally isolated. Meaning if that user logic is performing a first operation (e.g., transform A) and is being reconfigured to perform a second operation (e.g., transform B), data is to stop flowing through the user logic while the transition in programmed operations occurs. After configuration of the second operation is finished, data may be returned to the user logic, for example, by using ready and valid signals at an interface outside of the changing region (e.g., as microsector control signals from FSM 158) held steady during the reconfiguration.

It is noted that when a portion of the integrated circuit 12 is unused for a particular data transmission or processing operation, the portion of the integrated circuit 12 may be power gated or operated in a low power state. In these reduced power consumption states, the integrated circuit 12 may consume less power, thereby reducing power consumption of the application system 62 overall.

Once isolated, at block 256, the controller 76 may write the third configuration data directly to the first portion of configuration memory without adjusting or reading the second portion of configuration memory. Once written, at block 258, the controller 76 may perform an operation based on the third configuration data written in the first portion of the configuration memory and based on the second configuration data written in the second portion of configuration memory.

Keeping the forgoing in mind, sometimes it may be desired to move one or more scan flip-flops 224 (e.g., scan registers) out of the ALEs 110 of the microsector 92 to the data register 172. Doing so may reduce a number of scan flip-flops 224 used to support operations of the microsector 92, for example, by a factor of ten. By combining the structural adjustment of moving the scan flip-flops 224 outside of the ALEs 110 with additional structural adjustments, further performance improvements may be achieved. For example, including quasi-delay insensitive (QDI) circuitry may enable relatively faster shifting of user data out of the user register 222 of the microsector 92 (e.g., a frame read operation) and may enable filtering of user data that is unused out of the frame, thereby increasing processing speeds. As another example, using a Data In Shift register and the QDI circuitry may enable faster shifting of user data in to the user register 222 of the microsector 92 (e.g., a frame write operation). Additional or alterative benefits may also be achieved by using these systems and methods.

Figure 12:
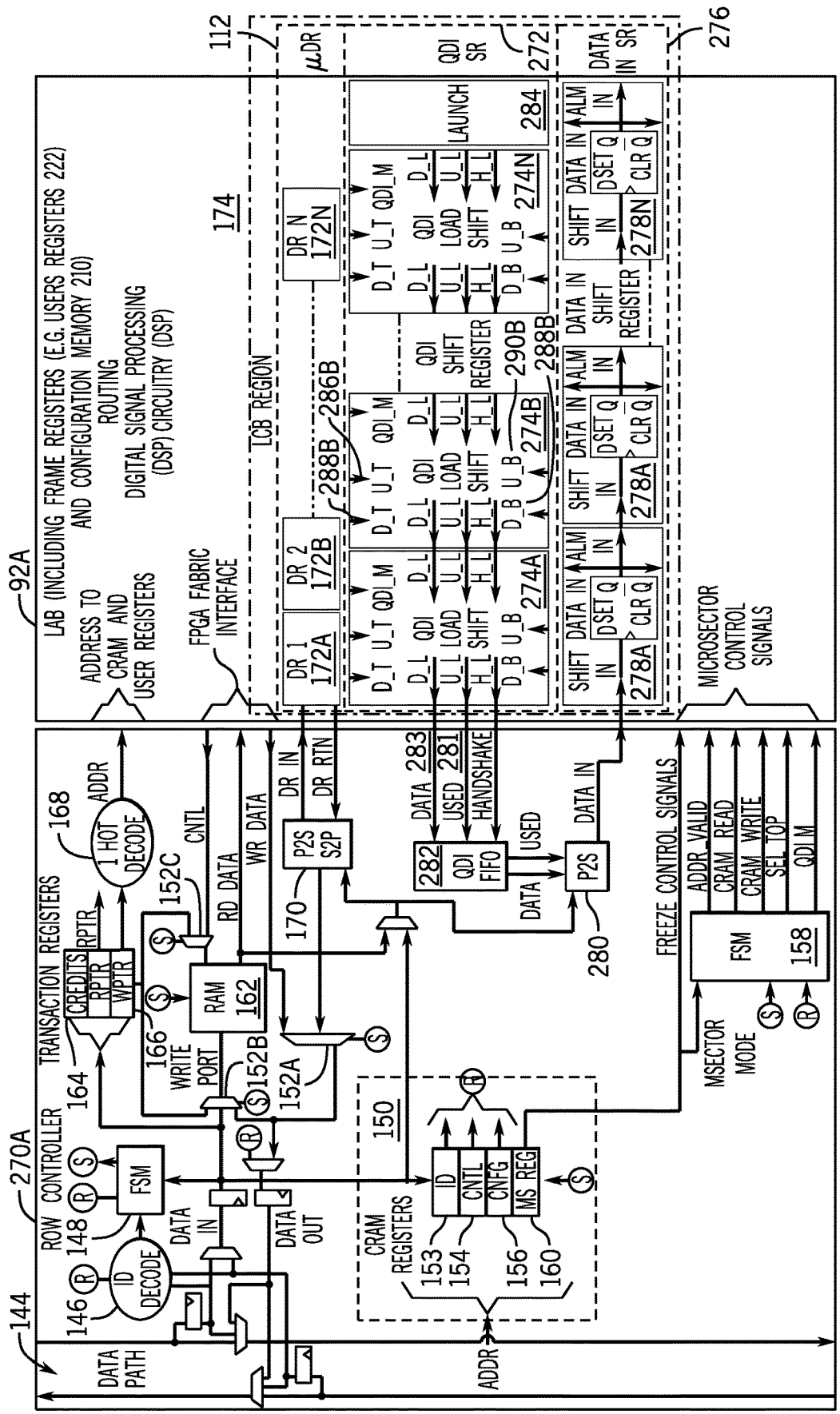
FIG. 12 is a block diagram of another example row controller and the microsector of FIG. 6 having another example of data registers, in accordance with an embodiment.

To elaborate, FIG. 12 is a block diagram of an example row controller 126, row controller 270A, and an example microsector 92A including a quasi-delay insensitive (QDI) shift register (SR) 272. The QDI SR 272 includes multiple serially coupled quasi-delay insensitive (QDI) Load Shift circuits 274 to provide the shift register architecture. The microsector 92A also includes a Data In shift register (SR) 276 formed from at least multiple serially coupled Data In shift circuits 278. Some of the circuitry shown perform similar operations to those discussed above, and in reference to FIG. 8, and thus is relied upon herein. Indeed, circuitry modified from FIG. 8 includes at least the FSM 148, the FSM 158, the CRAM registers 150, the P2S S2P block 170, multiplexer 152A, and changes to these components operations are generally discussed below. For ease of explanation, row controller 270A and microsector 92A are referenced. However, it should be understood that these descriptions are applicable to each row controller 270 and/or microsector 92 using a QDI SR 272 and/or a Data In SR 276. It is noted that arrangements shown are one example of suitable widths and combination of circuitry that may be used to implement the processes described herein.

The LSM 130 may instruct the row controller 270A to perform an access of its memory. Indeed, the LSM 130 may instruct a read operation, a write operation, or both as a read-modify-write (RMW) operation using a data packet 190 transmitted via the data path 144. The row controller 270A may receive the command from the LSM 130 via data path 144. The identifier decoder (ID Decode) block 146 may decode an identifier (ID) of the packet. By reading the ID of the packet, the ID Decode block 146 may identify whether the packet is relevant to the row controller 126A and/or whether the packet is intended to be received by the row controller 126A. The data path 144 may be shared by each row controller 270 of a respective AR 106, and thus the row controller 270A and the microsector 92A may be used in the arrangements shown at least in FIG. 7. As such, the data path 144 may also continue on to a subsequent row controller 270 of the AR 106A.

The row controller 270A also includes the FSM 148. The FSM 148 may be modified and support decoding of additional commands (e.g., commands received via the data path 144) when used in the row controller 270A, such as commands used to control internal data paths and/or the FSM 158. Indeed, the FSM 148 may work with other circuitries of the row controller 270A to instruct a read operation, write operation, or both (e.g., a RMW operation). The command from the LSM 130 may indicate to the row controller 270A to access CRAM 210 or to access user registers 222, sometimes referred to as "a register of a frame" or a "frame register." The row controller 270A may instruct at least somewhat different sets of operations for each combination of access operations. For example, the row controller 270A may use the μDR 112 for accessing configuration memory (e.g., CRAM 210) as described earlier and may use the QDI SR 272 and/or the Data In SR 276 for access of user registers 222.

To elaborate, comparing the row controller 270A to the row controller 126A, the μSR 176 may be replaced by the QDI SR 272 for read operations (and RMW operations) from the user registers 222 and by the Data In SR 276 for write operations to user registers 222. The row controller 270A may instruct these various read and write operations using signals output from the FSM 158, shown as modified in FIG. 12 to accommodate the addition of the QDI SR 272 and the Data In SR 276, and to accommodate the removal of the μSR 176. It is noted that the Data In SR 276 may also be a 1-bit wide data register making it functionally similar to the μSR 176 for write operations.

Since access of the CRAM 210 is similar for both the row controller 270A and the row controller 126A, descriptions are not repeated. However, read operations for reading from and/or write operations for writing to a currently selected user register 222 (e.g., selected by address output by the decoder block 168) are discussed. When reading data from the user register 222, the transmission via the QDI SR 272 may bypass and/or not involve the Data In SR 276. The reverse is also true. When writing data to the user register 222, the transmission via the Data In SR 276 may bypass and/or not involve the QDI SR 272.

A command for reading the user register 222 may indicate options for implementation by the FSM 148 and/or the FSM 158 when instructing the read operation. For example, the command may instruct via indication of the options a filtering out of data read from unused user registers 222 and/or a compression of the read data. When the read data is to be filtered, the read data may be returned from the microsector 92 using hardware and/or software of the QDI SR 272 to perform the filtering in transit. The filtering may remove placeholder data from the shifted data that otherwise indicates when portion of programmable memory (e.g., user registers 222) is unused. Thus, when read data is shifted from the QDI SR 272 and stored in the RAM 162, the read data stored excludes data from unused (e.g., unprogrammed) circuitry (e.g., memory). Data stored in the RAM 162 may be accessed for further processing and/or for transmission to the data path 144.

When performing a RMW operation, a read operation may be performed before the read data is modified according to instructions of the command and before the modified data is written back to its corresponding user registers 222. A location mask generated using shifted binary data output from the QDI SR 272 while reading the data from the user registers 222 may be referenced when determining which data to modify and how to write the modified data to the user registers 222. This is discussed further below with reference to operations of the QDI SR 272 and its outputs.

Write operations may involve writing a currently selected user register 222 (e.g., selected by address output by the decoder block 168) with write data. The command for writing the user register 222 may indicate options for implementation by the FSM 148 and/or the FSM 158 when instructing the write operation. For example, the command may instruct via indication of the options to decompress (or to not decompress) the write data before storage in the user register 222. When decompression is indicated, the row controller 270A may operate to decompress the write data according to a decoding or decompression process prior to writing the write data to the user register 222.

Control signals (S) output by the FSM 148 and/or the FSM 158 instruct circuitry of the microsector 270A to access memory. For example, the control signals (S) from the FSM 148 may select data from the QDI FIFO buffer 282 to be read back to the LSM 130A corresponding to the row controller 270A, the control signals (S) may instruct a write of data to a user register 222 by causing shifting of write data through Data In shift circuits 278 by instruction to a parallel-to-serial (P2S) block 280 is to output write data to the Data In SR 276, or the like.

The FSM 158 may instruct the P2S block 280 to output the write data to the Data In SR 276 for shifting through one or more Data In shift circuits 278 when instructing the writing of data to user register 222. The P2S block 280 transmits the write data to a first input of a first Data In shift circuit 278A. The FSM 158 may transmit a clock to initiate the shifting of the write data into the user register 222 addressed by an output from the decoder block 168 (e.g., Addr).

To elaborate further on memory access operations of the microsector 270A, read operations, RMW operations, and write operations are each discussed in more detail. When instructing any of these operations, the decoder block 168 may store and output an address of a targeted user register 222. This address may be derived from the data packet 190 instructing the operation. It is noted that the write operation associated with the RMW operation may be generally the same as a write operation instructed via the command, and that the read operation associated with the RMW operation may be generally the same as a read operation instructed via the command. Each are thus discussed below.

To perform a read operation of a user register 222, the FSM 158 may transmit control signals program the QDI Load Shift circuits 274 according to the instructions indicated by the command of the data packet 190. The FSM 158 may generate a mode signal (e.g., QDI_M input) to program a read operation in the QDI Load Shift circuits 274, where the read operation may be associated with a RMW operation. Once programed, the FSM 158 may transmit a first token to a launch block 284 coupled in series with the QDI Load Shift circuits 274. The first token may be a pulse generated by the FSM 158 and/or may be a pulse derived from a clocking signal.

Indeed, the launch block 284 inserts the first token into the QDI Load Shift circuit 274N to start data shifting from left (e.g., QDI Load Shift circuit 274A) to right (e.g., QDI Load Shift circuit 274N). The token itself is transmitted from right to left through the QDI SR 272. Generally, shifting from left to right is started by the FSM 158 by transmitting the token to the launch block 284, where the starting token is a clock pulse. Any suitable clock having timing to initiate the shifting at a time desired by the FSM 158 may be used to provide the token to the launch block 284. Sometimes, the FSM 158 uses the same clock provided to the user register 222 being read, such as when the data is to be captured synchronously on a free running clock. Sometimes, the FSM 158 uses a clock additional to the clock provided to the user registers 222, such as when data being read is sampled asynchronously to clocking of the integrated circuit 12 and/or when the clock provided to the user registers 222 in the frame is not running (e.g., disabled). It is noted that clocking signals transmitted to the launch block 284 initiate the shifting of the read data and may not be a sustained transmission to the launch block 284. Once a first pulse is transmitted to the launch block 284, transmission of the clock may stop since handshaking operations may be initiated with a pulse.

Example behaviors that may be set using the QDI_M input (e.g., QDI_M parameter) include the filter or no filter operation, a top selection operation, a bottom selection operation, the compression or no compression operation or the like.

When the top selection operation is indicated, the QDI Load Shift circuits 274 may receive data from the top half of the microsector 92A using terminals 286 (U_T) and terminals 288 (D_T). When the bottom selection operation is indicated, the QDI Load Shift circuits 274 may receive data from the bottom half of the microsector 92A using terminals 288 (D_B) and terminals 290 (U_B). When the compression operation is indicated, the QDI Load Shift circuits 274 may encode or compress read data before outputting shifted data to the QDI FIFO buffer 282. When the no filter operation is indicated (or the filter operation is not instructed), the QDI Load Shift circuits 274 may each insert a token, the read data, and the read used bit (U) into the shifted data regardless of a value of the read used bit. However, when the filter operation is instructed, the QDI Load Shift circuits 274 may not insert a token into shifted data (e.g., read data (D_T, D_L, D_B, D_R) and read used bit (U_T, U_L, U_B, U_R)) to be output to the QDI FIFO buffer 282.

Elaborating further on the filter operations, to filter the read data while the read data is shifted to the QDI FIFO buffer 282, each respective QDI Load Shift circuits 274 may pass through the received shifted data from a neighboring QDI Load Shift circuit 274 when a used bit is clear or insert its data bit into the shifted data if the used bit is set. Each QDI Load Shift circuit 274 may insert a token, in response to an in use bit (e.g., signal received at terminal 286 receiving the data from the top used bit (U_T) or at terminal 290 receiving the data from the bottom used bit (U_B)), thereby causing the QDI FIFO buffer 282 to receive one or more tokens corresponding to the used user registers 222. In response to receiving each token, the QDI FIFO buffer 282 may generate the location mask based on each token indicating which user registers 222 are used. The location mask may also be further elaborated on in discussions at least associated with FIGS. 13-15.

To compress read data, the QDI Load Shift circuits 274 may include hardware or software to compress the read data. Any suitable encoding and/or compression operation may be performed to reduce a number of bits to represent the read data. Compressed read data may be transmitted from the row controller 270A as part of a data packet, such as in slots 196.

The QDI shift register 272 may include multiple QDI Load Shift circuits 274 that each receive the QDI_M input, and thus that each are programmed based on the command. Indeed, after being programming and once the launch block 292 receives the first token, reading of data from the targeted user register 222 may begin.

The QDI SR 272 may output to the QDI FIFO buffer 282 data and the used bits read from the register frame. This output operation may use QDI handshaking techniques. QDI-related components, such as the QDI SR 272 and the QDI FIFO buffer 282, may support data movement and/or computation between storage elements without a clocking of each respective transmission, rather using a form of timing independent unidirectional or bidirectional handshaking between elements. QDI handshaking techniques may permit shifting data from the register frame at a rate that is much faster than a clock being provided to the register frames. Each QDI Load Shift circuit 274A may transmit binary data using handshaking signals used, for example, to establish router connections and/or other communication operations between different devices.

Using handshaking processes between QDI Load Shift circuits 274 may permit data transmission rates to increase relative other techniques since confirmation signals may not be waited on before transmitting a next handshake signal (since the handshake itself may transmit the bit to a downstream QDI Load Shift circuit 274), such as relative to the μSE 176 that uses a clocking signal to shift data to/from user registers 222. As an example, when user register 222 and/or the microsector 92A is clocked at 1 Gigahertz (GHz), the QDI SR 272 may shift out more than 5 bits within the logic high (e.g., "1" pulse) of the clock (e.g., a pulse having a logic high for a duration of time of 1 nanosecond (ns) for the 1 GHz clock). The QDI handshaking techniques may also permit filtering and/or decompression of the read data being shifted out from the QDI SR 272.

The QDI FIFO buffer 282 may receive serial data from the QDI SR 272 and may provide read data to the P2S block 280 and/or to the RAM 162. The location mask indicating which portions of memory are used and which portions of memory are unused of a portion the microsector 92A may also be transmitted to the P2S block 280 (e.g., Used).

To elaborate on RMW operations that use read operations similar to that described above, the P2S block 280 may modify data (e.g., perform selective write operations based on the location mask) before writing the modified data to memory when performing a RMW operation. When the command instructed a RMW operation, the read data is output to the P2S block 280 for modification before being written back to the user register 222 as part of a write operation.

The address indicated by the decoder block 168 is unchanged while the RMW operations are performed. Thus, the address used to indicate the user register 222 is the same during the modify operation and the write operation as during the read operation. The P2S block 280 may modify the read data by using the location mask generated by the QDI FIFO buffer 282 to perform a selective write operation (e.g., to modify data of one or more user registers 222).

The P2S block 280 may modify data to perform selective write operations to specific bits corresponding to the addressed user register 222 based on the location mask. Indeed, relative locations indicated by bit placement of the location mask (e.g., binary sequence of output from terminal 281) may correspond to a bit placement of shifted read data transmitted from terminal 283 (e.g., Data, read data from user registers 222). Through referencing of the location mask, the P2S block 280 may correlate bits output from the terminal 283 (e.g., read data) to relative memory locations based on values (e.g., "0" vs "1") and a relative sequence of bits output from the terminal 281 (e.g., location mask bits). The P2S block 280 may reference the location mask when determining which bits to modify prior to writing modified data back to user registers 222. It is noted that the location mask bits may also be output from the QDI FIFO buffer 282 if requested via a command, such as a command from the row controller 270, from the LSM 130, MCM 132, or any other suitable control or processing circuitry of the integrated circuit 12 and/or system 10. Once modified, P2S block 280 may be instructed to write the modified data to the addressed user register 222 as part of a write operation. The write operation associated with the RMW operation may be generally the same as a write operation instructed via the command. Both are thus discussed below.

To elaborate on write operations, the P2S block 280 may transmit write data (e.g., post-modification read data for the case of RMW operation, write data from data packet 190) to the Data In SR 276. When the command indicates to do so, the P2S block 280 may decompress the write data before writing the write data to memory. Shifting of the write data to the Data In SR 276 may initiate in response to a clocking signal from the FSM 158.

Indeed, based on the data packing mode indicated in the command, the P2S block 280 may decompress the write data before storing in the user register 222 to revert compressed data of the data packet 190 for writing. The write data, after any decompression is performed, may be written in response to a clock signal initiated by the FSM 158.

In some cases, such as when performing the RMW operation, the write operation is performed based on the location mask. In these cases, there may be a presumption that the FSM 148 has sequenced a read of the current user register 222 in order for the used bits to be correct. The P2S block 280 may combine write data with data received from the QDI FIFO buffer 282 using the location mask indicated in the command. For example, read data corresponding to where each mask bit is set to 1 is written with the read data received from the QDI FIFO buffer 282 and the write data received from the RAM 162 or the CRAM 150, where, when overlapping, the write data is used to overwrite the read data as part of the modify operation prior to writing back into the register frame and/or CRAM 210.

Keeping the forgoing in mind, an example user register 222 read may involve the controller 76 initializing the LSM 130 with a set of commands that instructs data to be read from some row controller 270 for transmission to one or more endpoint addresses. Endpoint addresses may refer to consumers of read data from the row controllers 270, and thus may correspond to other portions of the programmable logic 66, endpoints accessible by the interconnection resources 46, such as a network-on-chip (NOC) implementing routing circuitry having flexible bandwidths or configurable destination addresses for read data, data to be written, data to be processed, or the like. This may be similar to other direct-memory access (DMA)-type operations that may move data from one memory location to another memory location as a function of a list of commands.

As an example, the list of commands may instruct the LSM 130 to initialize a respective row controller 270A, to read of data from one or more user registers 222 of the microsector 96A, and to transmit the read data from the microsector 270A to the data path 144. The LSM 130 may generate the commands and transmit one or more commands to one or more row controller 270, including the row controller 270A, to read the desired data.

The LSM 130 may, for example, transmit a first command to the microsector 270A via the data path 144. Once identified as relevant for the microsector 270A by the ID Decode Block 146, the FSM 148 and/or FSM 158 may initialize a read operation according to one or more options indicated in the first command for the read operation (e.g., filter or no filter option, a top selection option, a bottom selection option). Once initialized, the microsector 270A may receive a second command instructing the read operation. Once identified as relevant for the microsector 270A by the ID Decode Block 146, the FSM 148 and/or FSM 158 may instruct the read operation indicated by the second command and may read data from user register 222 to the QDI FIFO buffer 282. During or after the data is read, the LSM 130 may transmit a third command to the microsector 270A via the data path 144 instructing the microsector 270A to transmit the read data to the LSM 130 from the QDI FIFO buffer 282. Once identified as relevant for the microsector 270A by the ID Decode Block 146, the FSM 148 and/or FSM 158 may instruct the transmission of the read data from the QDI FIFO buffer 282 to the data path 144, such as after the read data is added to slots 196 of the data packet 190 transmitting the third command in its header 192. In some cases, the third command may also include a destination address in the header 192 (e.g., endpoint address) that indicates to routing circuitry and/or other row controllers 270 where to transmit the data packet 190 with the read data once sent to the data path 144.

As generally described above, the microsector 92A may include logic circuitry to store values corresponding to configuration data. Configuration memory, such as CRAM 210, is used to store these values. Different access circuits may be included in the microsectors 92 to permit the row controllers 270 access the configuration memory. One example of an access circuit is shown in FIG. 13.

Figure 13:
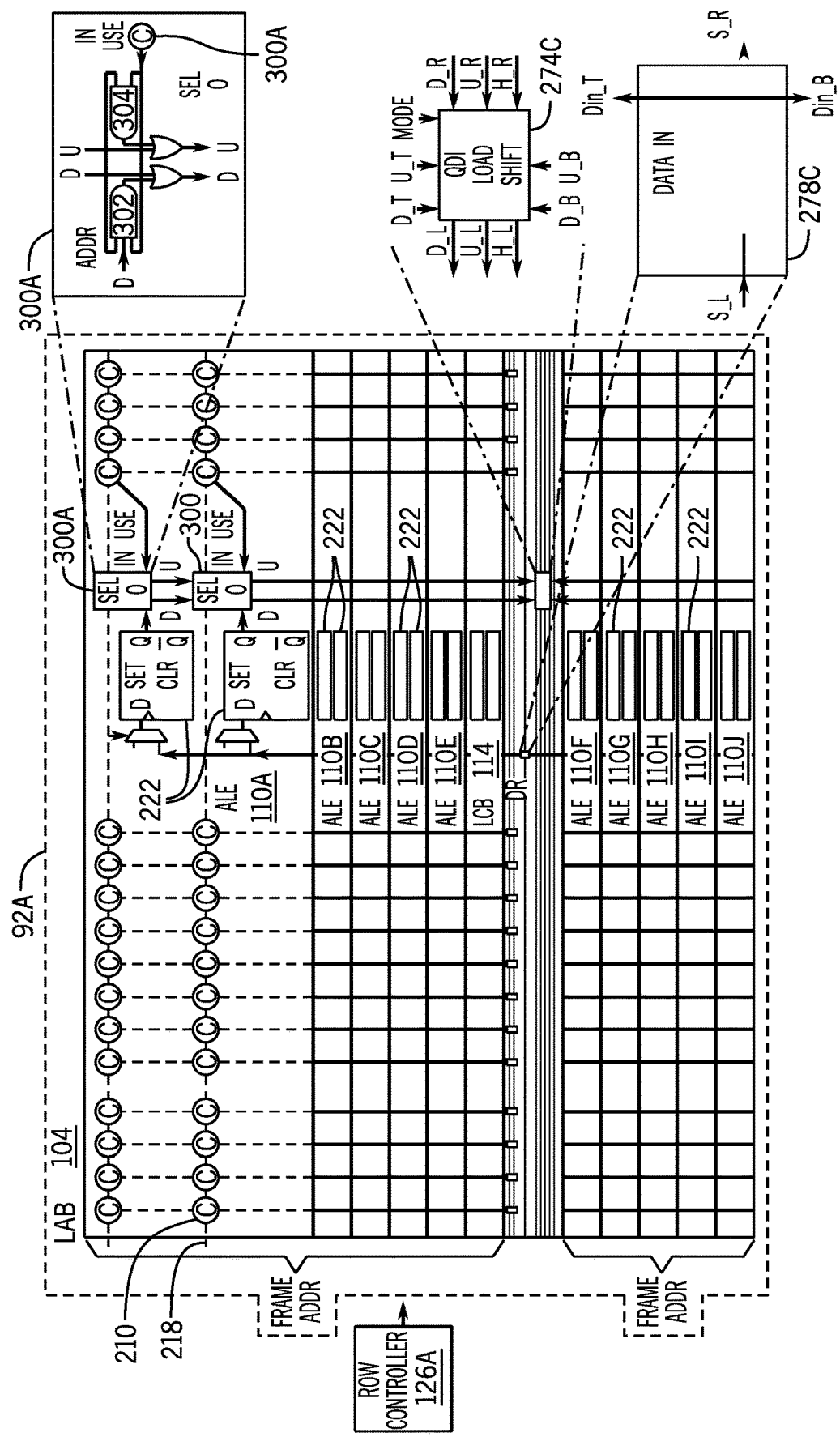
FIG. 13 is a block diagram of the row controller and the microsector of FIG. 12 that uses first example adaptive logic elements (ALEs), in accordance with an embodiment.

To elaborate further, FIG. 13 is a block diagram of the row controller 270A and the microsector 92A of FIG. 12. FIG. 13 may use at least some of the same circuitry as shown in FIG. 12 and in FIG. 10, and thus descriptions are relied upon herein for ease of explanation. One change between FIG. 12 and FIG. 10, however, is the use of a selection circuit (SEL O circuit) 300. Indeed, the SEL O circuit 300 includes circuitry different from that included in scan flip-flops 224. These changes are made, at least partially, for data access compatibility with the QDI SR 272 and the Data In SR 276. User registers 222, CRAM 210, and how each of those portions of the microsector 92 are accessed and/or used remain unchanged and cross compatible with changes made to accommodate the QDI SR 272 and/or the Data In SR 276.

The SEL O circuit 300 may include logic circuitry to enable an associated user register 222. The user register 222 may be accessed when the combination of the address stored in the decoder block 168 and the options implemented via control signals from the FSM 158 intersect at a selected row and a selected column of memory (e.g., user register 222).

The SEL O circuit 300A may transmit data stored in the user register 222 of the ALE 110A when the decoder block 168 clocks a logic high valued voltage (e.g., "1") to an input of logic gate 302. The logic gate 302 transmits when a combination of the address (ADDR), the data stored (D) in user register 222, and an in use bit (e.g., In use) cause the logic gate 302 to activate and change state at output. The logic gate 302 is shown as an AND logic gate, but it should be understood that any suitable combinational logic circuitry may be used here to perform a similar operation of outputting data in response to an addressing signal. The in use bit may transmit from a portion of the CRAM 210B, an example of a portion CRAM 210 dedicated to storing a value indicative of whether the user register 222 is in use and storing a user value. The CRAM 210 dedicated to storing the in use bit values may be disposed in a same column and may be accessed in any suitable manner, such as via the μDR 112. The in use bit may also be transmitted to logic gate 304 from the CRAM 210B to control whether the logic gate 304 transmits a logic high valued voltage (e.g., "1") when addressed using the address (ADDR). Thus, when the user register 222 is indicated as in use, data from the user register 222 is transmitted to the QDI SR 272 at a corresponding QDI Load Shift circuit 274C. When the in use bit indicated as not in use (e.g., by the logic gate 304 not transmitting a logic high valued voltage), data output from the SEL O circuit 300 is a logic low valued voltage (e.g., "0," system reference voltage) that indicates to the QDI Load Shift circuit 274C that the user register 222 is not in use at a time of addressing. The QDI Load Shift circuit 274C enables the read data and/or the read used bit value from the SEL O circuit 300 to transmitted back the row controller 270A using the QDI SR 272, such as by using asynchronous logic processes.

The Data In SR 276 may be included to offer a direct program option that permits the row controllers 270 to directly program respective user registers 222. The μDR 112 may shift data into the CRAM 210 and the Data In SR 276 may shift data to the user registers 222. Shifting data from the Data In SR 276 to the user registers 222 may involve additional routing circuitry disposed within the Data In shift circuits 278 to transmit shifted data from the Data In SR 276 to ALEs 110A-110E (e.g., top portion of microsector 92A) and/or to ALEs 110F-110J (e.g., bottom portion of microsector 92A) for storage. It is noted that the QDI SR 272 may be associated with a data read path from the user register 222 and the Data In SR 276 may be generally associated with a data write path used by the row controller 270A to write data to the user register 222.

Figure 14:
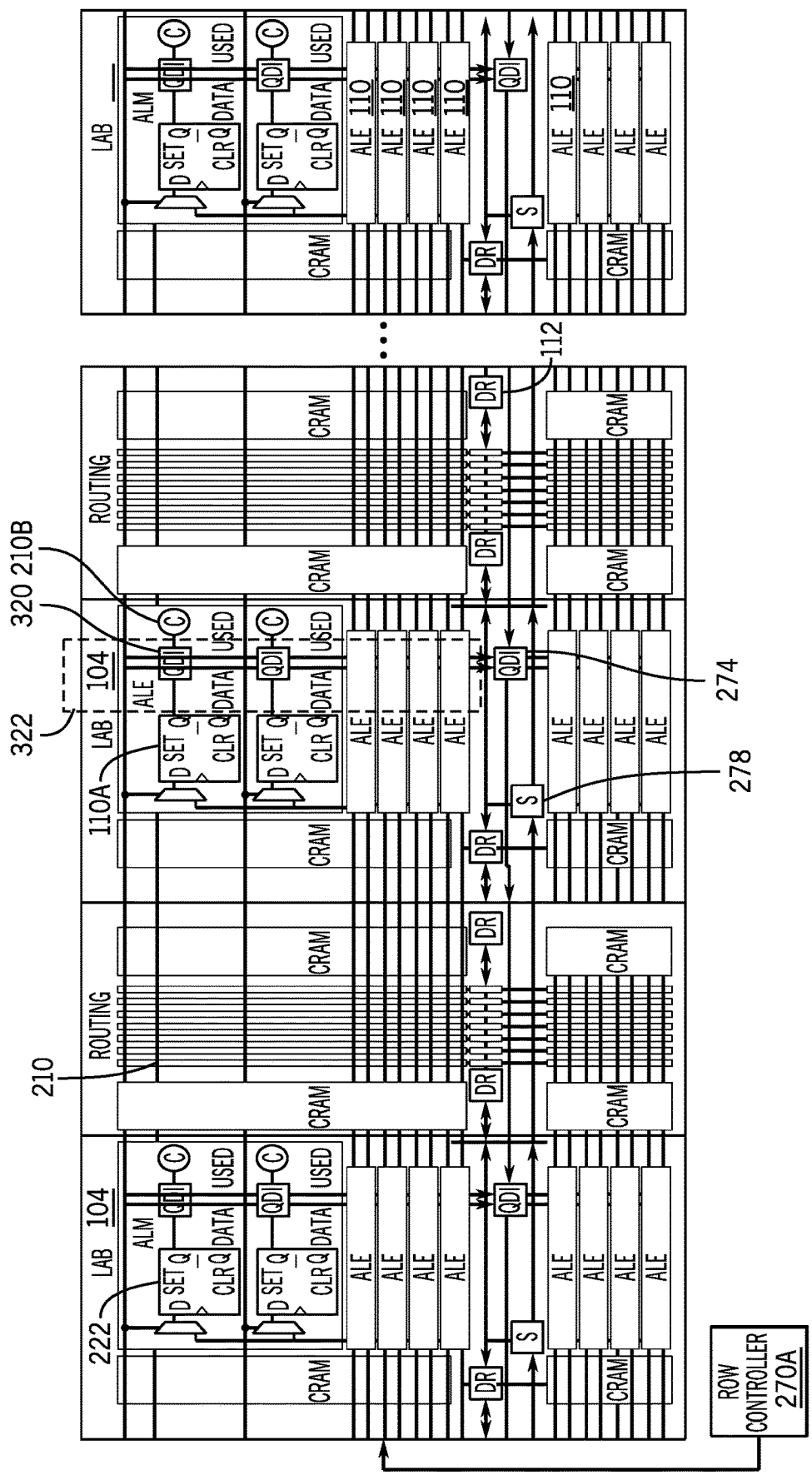
FIG. 14 is a block diagram of the row controller and the microsector of FIG. 12 having a second example of adaptive logic elements (ALEs), in accordance with an embodiment.

Differing circuitry may be used in place of logic circuitry of the SEL O circuits 300 to directly access the user registers 222. For example, FIG. 14 is a block diagram of the microsector 92A having another example of ALE 110 circuitry. ALE 110 of FIG. 14 differs from other ALE 110 of FIG. 13 and FIG. 10 at least since it includes QDI circuit 320. Indeed, some of the circuitry shown in FIG. 14 is the same as previously described, including the CRAM 210, the μDR 112, the QDI SR 272, the Data In SR 276 (S), and the like.

As opposed to using the address from the decoder block 168 to select a user register 222, CRAM 210 is used to select which user register 222 in each ALE 110 column is to be read. Data from the selected user registers 222 are read into a vertical QDI shift register 322 made from one or more QDI circuits 320. This may permit each user register 222 of the microsector 92A to be read when in use as opposed to taking the time to read each user register 222 one at a time.

The QDI circuit 320 may receive similar inputs as the SEL O circuit 300 of FIG. 13. The QDI circuit 320 may output read user data (Data, D) and in use data based on the in use bit (Used, U) to the QDI SR 272 for return to the row controller 270. The QDI circuit 320 may include any suitable circuitry to generate the read user data output and to generate the in use bit data for transmission by the QDI SR 272. Similarly, the Data In SR 276 may write data to the user register 222 using similar methods as described above.

Figure 15:
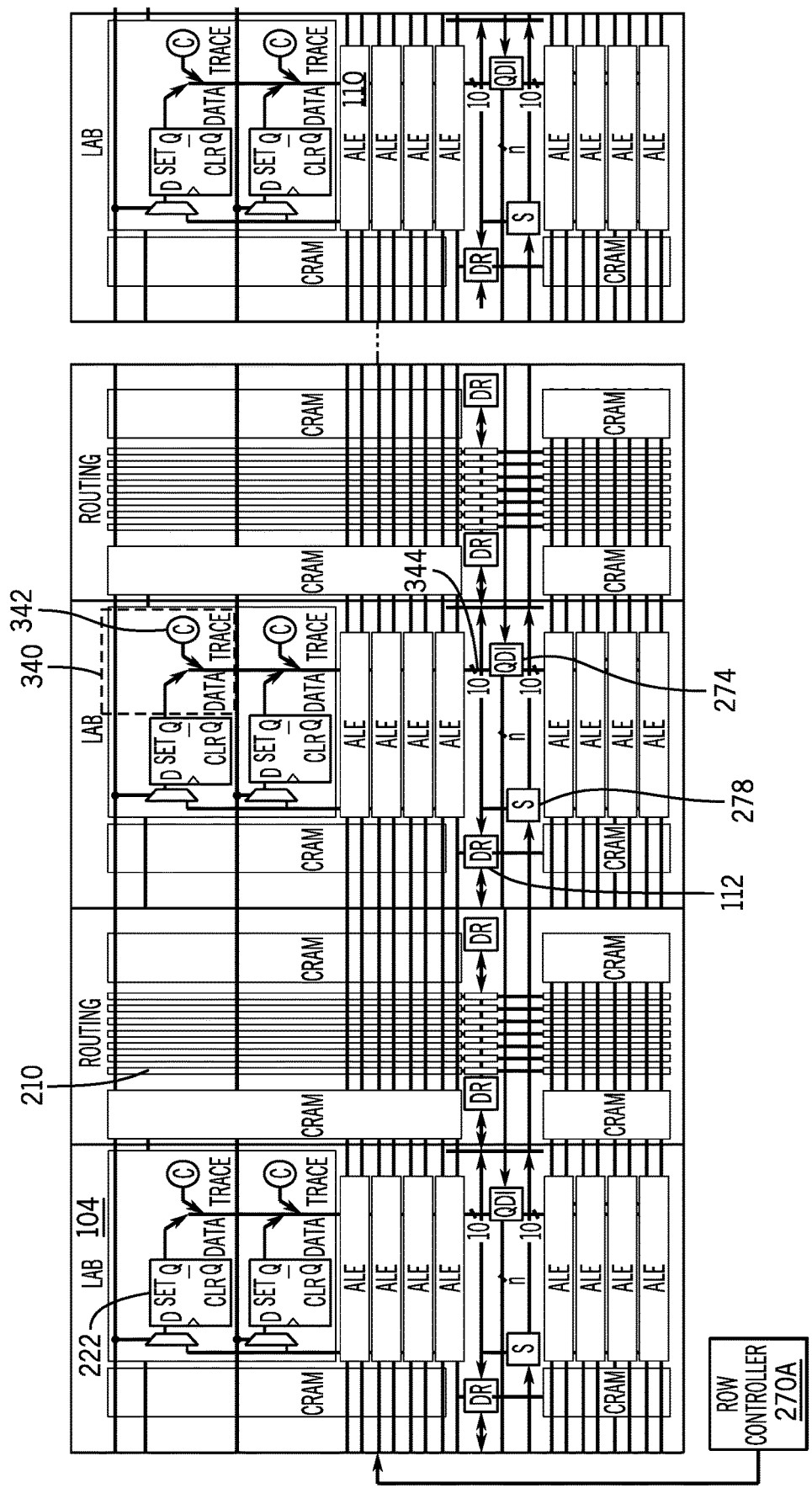
FIG. 15 is a block diagram of the row controller and the microsector of FIG. 12 having a third example of adaptive logic elements (ALEs), in accordance with an embodiment.

Other circuitry may be used in place of logic circuitry of the SEL O circuits 300 to directly access the user registers 222. For example, FIG. 15 is a block diagram of the microsector 92A having another example of ALE 110 circuitry. ALE 110 of FIG. 15 differs from other ALE 110 of FIG. 14, FIG. 13, and FIG. 10 at least since it includes logic circuit 340. Indeed, some of the circuitry shown in FIG. 14 is the same as previously described, including the CRAM 210, the μDR 112, the QDI SR 272, the Data In SR 276 (S), and the like.

Each output from user register 222 and each corresponding in use bit from CRAM 342 are routed toward the LCB 114 in respective data paths to respective QDI SR 272. Indeed, the QDI SR 272 is replicated such that each of the vertically transmitting bits from the user register and CRAM 342 storing in use bits may be shifted out in parallel. Thus, the horizontal QDI SR 272 is 10 bits wide and includes 10 times the number of QDI Load Shift blocks 274 to form each respective QDI SR 272. This parallel transmission is represented by the data width of 10 indicated on path 344. In cases where relatively higher data reading speeds are desired, this design may be used since each user register in a column of a LAB 104 may be read out in parallel. It is noted that the QDI FIFO buffer 282, and any other supporting component, that receives the data from the QDI SR 272 may also be scaled to support reception of the 10 parallel QDI SR 272. It is noted that the Data In SR 276 may write data to the user register 222 using similar methods as described above. In some cases, the Data In SR 276 data paths may be scaled to permit parallel writing operations similar to the parallel reading operations described with reference to the parallel QDI SR 272.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Moreover, any suitable combination of number formats (e.g., single-precision floating-point, half-precision floating-point, bfloat16, extended precision and/or the like) may be used. Further, each DSP circuitry and/or DSP architecture may include any suitable number of elements (e.g., adders, multipliers 64, routing, and/or the like). Accordingly, it should be understood that the disclosure is not intended to be limited to the particular forms disclosed. The disclosure is to cover all modifications, equivalents, and alternatives falling within the spirit and scope of the disclosure as defined by the following appended claims.

Technical effects of the present disclosure include system and methods that provide a microsector architecture. The microsector architecture described herein may benefit operations of programmable logic devices, such as field programmable gate arrays and/or other configurable devices, by permitting programming of programmable fabric to occur over smaller regions of fabric. Systems and methods described relate to providing frame-based selection of ALE user registers for read and write operations as opposed to scan-based access to the ALE user registers. The systems may use a quasi-delay insensitive (QDI) circuit as part of a QDI shift register. The QDI SR may be used to perform a register read at a rate faster than other techniques and/or than using clocking methods to read out data from the ALE user registers. The QDI circuit may perform local filtering and/or decompression operations to improve read data at delivery. Furthermore, read-modify-write operations may be combined with a mask generated from data output from the QDI circuit to enable selective write of data within the frame of ALE user registers. These systems and methods may be used in combination with an additional QDI SR disposed in series with the ALE user registers to form a vertical shift register or in combination with multiple horizontal QDI shift registers that receive data in parallel from each ALE user register of a frame (e.g., each ALE associated with a logic access block (ALB)). Each combination may improve data read and write times and/or improve a precise of unit to deploy user designs in relative to other programmable fabric designs.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

Clause 1.
An integrated circuit, comprising:
a first microsector, comprising:
memory configured to store first data and second data;
a data register configured to write the first data to the memory;
a first shift register configured to receive the second data from the memory, wherein the second data bypasses the data register in transmission to the first shift register; and
a row controller coupled to the first microsector, wherein the row controller receives the second data in response to transmitting a control signal to the first shift register to instruct the read of the second data.

Clause 2.
The integrated circuit of example embodiment 1, wherein the row controller transmits the data read from the memory in one or more slots of a packet.

Clause 3.
The integrated circuit of example embodiment 1, wherein a plurality of logic gates are used to access the data read from the memory in response to a signal indicative of an address, the data read from the memory, and an in use signal permitting access of the data read from the memory.

Clause 4.
The integrated circuit of example embodiment 1, comprising an additional row controller disposed below the row controller, wherein the additional row controller and the row controller are coupled to a shared data path, and wherein the row controller is configured to access a header of a data packet transmitted via the shared data path before the additional row controller is permitted to check the header.

Clause 5.
The integrated circuit of example embodiment 4, wherein the row controller is configured to:
determine that the header matches at least a portion of an identifier associated with the row controller; and
shift the data packet from the shared data path to stop transmission of the data packet via the shared data path.

Clause 6.
The integrated circuit of example embodiment 1, wherein the memory is configured to couple directly to the first shift register, and wherein the first microsector comprises:
an additional memory disposed in a same column as the memory; and
a second shift register comprising a same number of circuitry as the first shift register, wherein the second shift register and the first shift register are configured to shift in parallel the data read from the memory and data read from the additional memory.

Clause 7.
The integrated circuit of example embodiment 1, wherein the first microsector comprises a second shift register configured to transmit the data read from the memory to the first shift register, wherein the first shift register and the second shift register comprise a plurality of quasi-delay insensitive (QDI) circuits coupled in series.

Clause 8.
The integrated circuit of example embodiment 7, wherein each respective QDI circuit of the plurality of QDI circuits use a handshake to transmit the data read from the memory.

Clause 9.
The integrated circuit of example embodiment 8, wherein the data register comprises a 1-bit wide data path, a first flip-flop, and a second flip-flop, and wherein the 1-bit wide data path couples between the first flip-flop and the second flip-flop.

Clause 10.
A method, comprising:
receiving a data packet from a data path;

generating, using a finite state machine, a plurality of control signals to read stored data from a register of a microsector at least in part by a shifting the read stored data from the register to a buffer using a quasi-delay insensitive (QDI) shift register in response to the data packet, wherein the QDI shift register receives a read data bit from the register and an in use bit from configuration memory;

inserting the read stored data to add one or more bits to one or more slots of the data packet; and transmitting the data packet comprising the read stored data to the data path.

Clause 11.

The method of example embodiment 10, comprising:

generating a mode signal configured to indicate to the QDI shift register to filter the read stored data as part of the shifting; and transmitting the mode signal to the QDI shift register.

Clause 12

The method of example embodiment 10, comprising:

determining the data packet comprises:
a header matching an identifier stored in a decoder;
a first data portion corresponding to configuration data to be stored in a first register; and
a second data portion corresponding to data to be written in the configuration memory;
storing the first data portion in the first register; and
storing the second data portion in a volatile memory.

Clause 13.

The method of example embodiment 12, comprising generating, via a local sector manager disposed outside programmable logic of a programmable logic device, the data packet, wherein the header is configured to instruct the reading of the read stored data.

Clause 14.

The method of example embodiment 10, comprising:
receiving a subsequent data packet comprising a header from the data path, wherein the data path is coupled to a plurality of row controllers;
determining that the header does not match an identifier stored in a decoder; and
returning the subsequent data packet to the data path for transmission to another row controller of the plurality of row controllers.

Clause 15.

A system, comprising:
programmable logic comprising a plurality of configuration memory and a register; and
control circuitry disposed between portions of the programmable logic and on a same board, wherein the control circuitry is configured to:
receive a data packet from a data path; and
generate, using a finite state machine, a plurality of control signals to read stored data from the register of a microsector at least in part by a shifting the read stored data from the register to a buffer using a quasi-delay insensitive (QDI) shift register in response to the data packet, wherein the QDI shift register is configured to transmit the read stored data based at least in part on handshaking operations.

Clause 16.

The system of example embodiment 15, wherein the QDI shift register receives a read data bit from the register and an in use bit from a subset the plurality of the configuration memory, wherein the QDI shift register determines to filter the read data bit from the read stored data based at least in part on in use bit.

Clause 17.

The system of example embodiment 15, wherein the control circuitry is configured to write data to a subset of the plurality of configuration memory of the microsector based at least in part on shifting of target data through each 1-bit data register of the microsector no more than once.

Clause 18.

The system of example embodiment 15, wherein the handshaking operations permit progression of the transmission of the read stored data toward the buffer without using a rising edge of a clock to progress the transmission.

Clause 19.

The system of example embodiment 15, comprising additional control circuitry disposed outside the programmable logic and on a same board, wherein the control circuitry comprises a row controller, and wherein the additional control circuitry is configured to generate the data packet to indicate a command for the row controller to access the stored data of the microsector.

Clause 20.

The system of example embodiment 19, wherein the row controller is configured to receive the data packet and, after verifying that the data packet comprises the header having an identifier matching an identifier of the row controller, generating the plurality of control signals to implement a command indicated by the header.

What is claimed is:

1. An integrated circuit, comprising:
a first microsector, comprising:
memory configured to store first data and second data;
a data register configured to write the first data to the memory;
a first shift register configured to receive the second data from the memory, wherein the second data bypasses the data register in transmission to the first shift register; and
a row controller coupled to the first microsector, wherein the row controller receives the second data in response to transmitting a control signal to the first shift register to instruct a read of the second data.

2. The integrated circuit of claim 1, wherein the row controller transmits the second data read from the memory in one or more slots of a packet.

3. The integrated circuit of claim 1, wherein a plurality of logic gates are used to access the second data read from the memory in response to a signal indicative of an address, the second data read from the memory, and an in use signal permitting access of the second data read from the memory.

4. The integrated circuit of claim 1, comprising an additional row controller disposed below the row controller, wherein the additional row controller and the row controller are coupled to a shared data path, and wherein the row controller is configured to access a header of a data packet transmitted via the shared data path before the additional row controller is permitted to check the header.

5. The integrated circuit of claim 4, wherein the row controller is configured to:
determine that the header matches at least a portion of an identifier associated with the row controller; and
shift the data packet from the shared data path to stop transmission of the data packet via the shared data path.

6. The integrated circuit of claim 1, wherein the memory is configured to couple directly to the first shift register, and wherein the first microsector comprises:
an additional memory disposed in a same column as the memory; and a second shift register comprising a same number of circuitry as the first shift register, wherein the second shift register and the first shift register are configured to shift in parallel the second data read from the memory and data read from the additional memory.

7. The integrated circuit of claim 1, wherein the first microsector comprises a second shift register configured to transmit the second data read from the memory to the first shift register, wherein the first shift register and the second shift register comprise a plurality of quasi-delay insensitive (QDI) circuits coupled in series.

8. The integrated circuit of claim 7, wherein each respective QDI circuit of the plurality of QDI circuits use a handshake to transmit the second data read from the memory.

9. The integrated circuit of claim 8, wherein the data register comprises a 1-bit wide data path, a first flip-flop, and a second flip-flop, and wherein the 1-bit wide data path couples between the first flip-flop and the second flip-flop.

10. A method, comprising:
receiving a data packet from a data path;
generating, using a finite state machine, a plurality of control signals to read stored data from a register of a microsector at least in part by a shifting the read stored data from the register to a buffer using a quasi-delay insensitive (QDI) shift register in response to the data packet, wherein the QDI shift register receives a read data bit from the register and an in use bit from configuration memory;
inserting the read stored data to add one or more bits to one or more slots of the data packet; and
transmitting the data packet comprising the read stored data to the data path.

11. The method of claim 10, comprising:
generating a mode signal configured to indicate to the QDI shift register to filter the read stored data as part of the shifting; and
transmitting the mode signal to the QDI shift register.

12. The method of claim 10, comprising:
determining the data packet comprises:
a header matching an identifier stored in a decoder;
a first data portion corresponding to configuration data to be stored in a first register; and
a second data portion corresponding to data to be written in the configuration memory;
storing the first data portion in the first register; and
storing the second data portion in a volatile memory.

13. The method of claim 12, comprising generating, via a local sector manager disposed outside programmable logic of a programmable logic device, the data packet, wherein the header is configured to instruct the reading of the read stored data.

14. The method of claim 10, comprising:
receiving a subsequent data packet comprising a header from the data path, wherein the data path is coupled to a plurality of row controllers;
determining that the header does not match an identifier stored in a decoder; and
returning the subsequent data packet to the data path for transmission to another row controller of the plurality of row controllers.

15. A system, comprising:
programmable logic comprising a plurality of configuration memory and a register; and
control circuitry disposed between portions of the programmable logic and on a same board, wherein the control circuitry is configured to:
receive a data packet from a data path; and
generate, using a finite state machine, a plurality of control signals to read stored data from the register of a microsector at least in part by a shifting the read stored data from the register to a buffer using a quasi-delay insensitive (QDI) shift register in response to the data packet, wherein the QDI shift register is configured to transmit the read stored data based at least in part on handshaking operations.

16. The system of claim 15, wherein the QDI shift register receives a read data bit from the register and an in use bit from a subset the plurality of the configuration memory, wherein the QDI shift register determines to filter the read data bit from the read stored data based at least in part on in use bit.

17. The system of claim 15, wherein the control circuitry is configured to write data to a subset of the plurality of configuration memory of the microsector based at least in part on shifting of target data through each 1-bit data register of the microsector no more than once.

18. The system of claim 15, wherein the handshaking operations permit progression of the transmission of the read stored data toward the buffer without using a rising edge of a clock to progress the transmission.

19. The system of claim 15, comprising additional control circuitry disposed outside the programmable logic and on a same board, wherein the control circuitry comprises a row controller, and wherein the additional control circuitry is configured to generate the data packet to indicate a command for the row controller to access the stored data of the microsector.

20. The system of claim 19, wherein the row controller is configured to receive the data packet and, after verifying that the data packet comprises a header having an identifier matching an identifier of the row controller, generating the plurality of control signals to implement a command indicated by the header.

* * * * *